(12) United States Patent
Park et al.

(10) Patent No.: US 10,410,919 B2
(45) Date of Patent: Sep. 10, 2019

(54) METHODS OF FORMING WIRING STRUCTURES FOR SEMICONDUCTOR DEVICES

(71) Applicant: Samsung Electronics Co., Ltd., Suwon-si, Gyeonggi-do (KR)

(72) Inventors: Yeong-Shin Park, Seoul (KR); Young-Jae Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/296,202

(22) Filed: Oct. 18, 2016

(65) Prior Publication Data
US 2017/0236751 A1    Aug. 17, 2017

(30) Foreign Application Priority Data
Feb. 17, 2016 (KR) .................. 10-2016-0018216

(51) Int. Cl.
*H01L 21/311* (2006.01)
*H01L 21/768* (2006.01)
*H01L 23/522* (2006.01)

(52) U.S. Cl.
CPC .. *H01L 21/76877* (2013.01); *H01L 21/31116* (2013.01); *H01L 21/76804* (2013.01); *H01L 21/76808* (2013.01); *H01L 21/76816* (2013.01); *H01L 21/76834* (2013.01); *H01L 23/5226* (2013.01); *H01L 21/76873* (2013.01)

(58) Field of Classification Search
None
See application file for complete search history.

(56) References Cited

U.S. PATENT DOCUMENTS

| | | |
|---|---|---|
| 6,001,414 A | 12/1999 | Huang et al. |
| 6,077,769 A | 6/2000 | Huang et al. |
| 6,660,630 B1 | 12/2003 | Chang et al. |
| 6,680,248 B2 | 1/2004 | Huang et al. |
| 7,354,856 B2 | 4/2008 | Yeh et al. |
| 7,553,758 B2 | 6/2009 | Park et al. |
| 8,264,086 B2 | 9/2012 | Shue et al. |
| 8,492,271 B2 | 7/2013 | Tomita |

(Continued)

FOREIGN PATENT DOCUMENTS

| | | |
|---|---|---|
| KR | 20100109173 A | 10/2010 |
| KR | 101202800 B1 | 11/2012 |

*Primary Examiner* — Jay C Chang
(74) *Attorney, Agent, or Firm* — Harness, Dickey & Pierce, P.L.C.

(57) ABSTRACT

A method of fabricating a wiring structure for a semiconductor device may include forming a lower wiring in a lower insulating layer, forming an etch stop layer covering the lower insulating layer and the lower wiring, forming an interlayer insulating layer on the etch stop layer, forming a preliminary via-hole through the interlayer insulating layer, partially etching the interlayer insulating layer to form a trench partially merged with the preliminary via-hole and a via-hole defined by a remaining portion of the preliminary via-hole, removing the etch stop layer exposed by the via-hole to expose the lower wiring, partially etching a contact area at which the trench and the via-hole are in contact with each other and forming an upper wiring in the via-hole and the trench to be electrically connected to the lower wiring.

17 Claims, 31 Drawing Sheets

(56) References Cited

U.S. PATENT DOCUMENTS

| | | | |
|---|---|---|---|
| 2005/0054192 A1* | 3/2005 | Kang | H01L 21/76804 438/629 |
| 2006/0270214 A1* | 11/2006 | Iba | H01L 21/76808 438/637 |
| 2007/0275554 A1* | 11/2007 | Kawano | H01L 21/76804 438/629 |
| 2008/0050926 A1* | 2/2008 | Nakagawa | H01L 21/31116 438/710 |
| 2008/0293198 A1* | 11/2008 | Kojima | H01L 21/28273 438/259 |
| 2012/0248609 A1* | 10/2012 | Tomita | H01L 21/76804 257/751 |

* cited by examiner

METHODS OF FORMING WIRING STRUCTURES FOR SEMICONDUCTOR DEVICES

CROSS-REFERENCE TO RELATED APPLICATION

This U.S. non-provisional patent application claims priority under 35 U.S.C. § 119 to Korean Patent Application No. 10-2016-0018216, filed on Feb. 17, 2016, the contents of which are hereby incorporated herein by reference in its entirety.

FIELD

The example embodiments of the inventive concepts generally relate to methods of fabricating semiconductor devices, and/or to methods of forming wiring structures for semiconductor devices.

BACKGROUND

Semiconductor device includes a wiring structure for electrically connecting signal lines disposed on different levels from each other. The wiring structure includes openings and conductive patterns for interconnecting. For example, openings are formed to expose lower conductive patterns, and a conductive layer is deposited in the openings to form conductive patterns.

As integration density of the semiconductor device increases, there is an increasing demand for more advanced etching processes for forming the opening.

SUMMARY

Some example embodiments of the inventive concepts concepts relate to a method of fabricating a wiring structure with improved structural reliability.

Other example embodiments of the inventive concepts concepts relate to a method of fabricating a semiconductor device including a wiring structure with improved structural reliability.

According to some example embodiments of the inventive concepts concepts, a method of fabricating a wiring structure for a semiconductor device may include forming a lower wiring in a lower insulating layer, forming an etch stop layer covering the lower insulating layer and the lower wiring, forming an interlayer insulating layer on the etch stop layer, forming a preliminary via-hole through the interlayer insulating layer, partially etching the interlayer insulating layer to form a trench partially merged with the preliminary via-hole and a via-hole defined by a remaining portion of the preliminary via-hole, removing the etch stop layer exposed by the via-hole to expose the lower wiring, partially etching a contact area at which the trench and the via-hole are in contact with each other and forming an upper wiring in the via-hole and the trench to be electrically connected to the lower wiring.

According to some example embodiments of the inventive concepts, a method of fabricating a wiring structure for a semiconductor device may include forming a lower wiring in a lower insulating layer, forming a first etch stop layer covering the lower insulating layer and the lower wiring, forming an interlayer insulating layer on the first etch stop layer, forming a preliminary via-hole through the interlayer insulating layer, forming a sacrificial pattern in the preliminary via-hole, partially removing an upper portion of the sacrificial pattern, etching an upper portion of the interlayer insulating layer to form a trench connected with an upper portion of the preliminary via-hole and a via-hole in which the sacrificial pattern remains, removing the sacrificial pattern remaining in the via-hole, etching the first etch stop layer exposed through the via-hole to expose the lower wiring, and forming an upper wiring in the trench and the via-hole to be electrically connected to the lower wiring.

According to some example embodiments of the inventive concepts, a method of fabricating a wiring structure for a semiconductor device may include forming a lower wiring in a lower insulating layer, forming an etch stop layer covering the lower insulating layer and the lower wiring, forming an interlayer insulating layer on the etch stop layer, forming a preliminary via-hole through the interlayer insulating layer, forming a sacrificial pattern partially filling the preliminary via-hole, partially etching the interlayer insulating layer up to a height which corresponds to the sacrificial pattern to form a trench, removing the sacrificial pattern to form the via-hole, etching the etch stop layer exposed through the via-hole to expose the lower wiring, partially etching the interlayer insulating layer on a contact area at which the trench and the via-hole are in contact with each other, and forming an upper wiring in the trench and the via-hole to be electrically connected to the lower wiring.

According to some example embodiments of the inventive concepts, a method of fabricating a wiring structure for a semiconductor device may include forming a device isolation layer on a substrate to form a plurality of active patterns, forming a gate structure on the active patterns, forming a source/drain layer in an upper portion of the active pattern adjacent to the gate structure, forming a lower insulating layer covering the gate structure on the active pattern and the device isolation layer, forming a contact plug through the lower insulating layer to be electrically connected to the source/drain layer, forming an etch stop layer on the contact plugs and the lower insulating layer, forming an interlayer insulating layer on the etch stop layer, forming a preliminary via-hole through the interlayer insulating layer, etching an upper portion of the interlayer insulating layer to form a trench connected with the preliminary via-hole and a via-hole formed from the preliminary via-hole, removing the etch stop layer exposed through the via-hole to expose the contact plug, partially etching a contact area of the trench and the via-hole after exposing the contact, and forming an upper wiring in the trench and the via-hole to be electrically connected to the lower wiring.

Example embodiments relate to a method of fabricating a wiring structure for a semiconductor device, the method including forming a lower structure, forming an interlayer insulating layer on the lower structure, forming a via-hole through the interlayer insulating layer, the via-hole having a width, partially filling the via-hole with a sacrificial pattern, the sacrificial pattern having a height, etching a portion of the interlayer insulating layer to form a trench, the trench being wider than the width of the via-hole, a distance between a lower surface of the trench and the lower structure being equal to the height of the sacrificial pattern, etching the lower structure, and forming an upper wiring in the via-hole and the trench to be electrically connected to the lower structure. The lower structure may include a lower insulating layer, a lower wiring in the insulating layer and an etch stop on the lower insulating layer and the lower wiring.

BRIEF DESCRIPTION OF THE DRAWINGS

Some example embodiments will be more clearly understood from the following brief description taken in conjunction with the accompanying drawings. The accompanying drawings represent non-limiting, some example embodiments as described herein.

Figure 1:
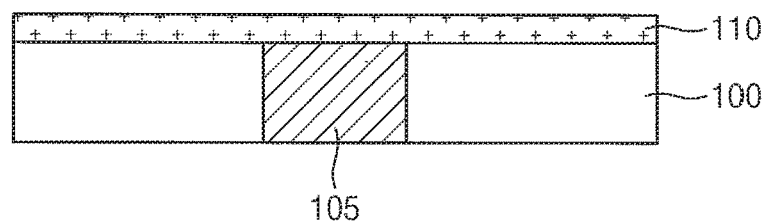
FIGS. 1 to 14 are cross-sectional views illustrating a method of fabricating a wiring structure for a semiconductor device according to some example embodiments of the inventive concepts.

It should be noted that these figures are intended to illustrate the general characteristics of methods, structures and/or materials utilized in certain example embodiments and to supplement the written description provided below. These drawings may not, however, to scale and may not precisely reflect the precise structural or performance characteristics of any given embodiment, and should not be interpreted as defining or limiting the range of values or properties encompassed by some example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EMBODIMENTS

These and other features and advantages are described in, or are apparent from, the following detailed description of various example embodiments.

In the drawing figures, the dimensions of layers and regions may be exaggerated for clarity of illustration. Like reference numerals refer to like elements throughout. The same reference numbers indicate the same components throughout the specification.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIGS. 1 to 14 are cross-sectional views illustrating a method of fabricating a wiring structure for a semiconductor device according to some example embodiments of the inventive concepts.

Referring to FIG. 1, a lower wiring 105 may be formed in a lower insulating layer 100. A first etch stop layer 110 may be formed on the lower insulating layer 100 and the lower wiring 105.

For example, the lower insulating layer 100 may be formed of or include a silicon oxide-based material such as plasma enhanced oxide (PEOX), tetraethyl orthosilicate (TEOS) and silicate glass.

In some example embodiments, the lower insulating layer 100 may cover integrated circuit devices that are formed on a substrate.

The substrate may include a semiconductor substrate such as, for example, a silicon substrate, a germanium substrate or a silicon-germanium substrate. The substrate may also include a silicon-on-insulator (SOI) substrate or a germanium-on-insulator (GOI) substrate. The substrate may also include compound such as InP, GaP, GaAs and GaSb.

In some example embodiments, a gate structure, an impurity region, a contact structure, a plug and a capacitor may be further formed on the substrate.

The lower insulating layer 100 may be formed by at least one of chemical vapor deposition (CVD), plasma enhanced chemical vapor deposition (PECVD), low pressure chemical vapor deposition (LPCVD), high density plasma chemical vapor deposition (HDPCVD), spin coating, sputtering and atomic layer deposition (ALD).

In some example embodiments, the lower insulating layer 100 may be partially removed to form an opening such as a hole or a trench, and then a conductive layer such as copper, tungsten and aluminum may be deposited or plated on the lower insulating layer 100 to fill the opening. An upper portion of the conductive layer may be polished or etched by a subsequent chemical mechanical polishing (CMP) process or an etch-back process so that the lower wiring 105 may be formed in the opening. The lower wiring 105 may be electrically connected to the integrated circuit device formed on the substrate.

The first etch stop layer 110 may be formed of or include a nitride-based material such as silicon nitride, silicon oxynitride and/or silicon carbide nitride, which are formed by a CVD process, an ALD process or a sputtering process.

Figure 2:
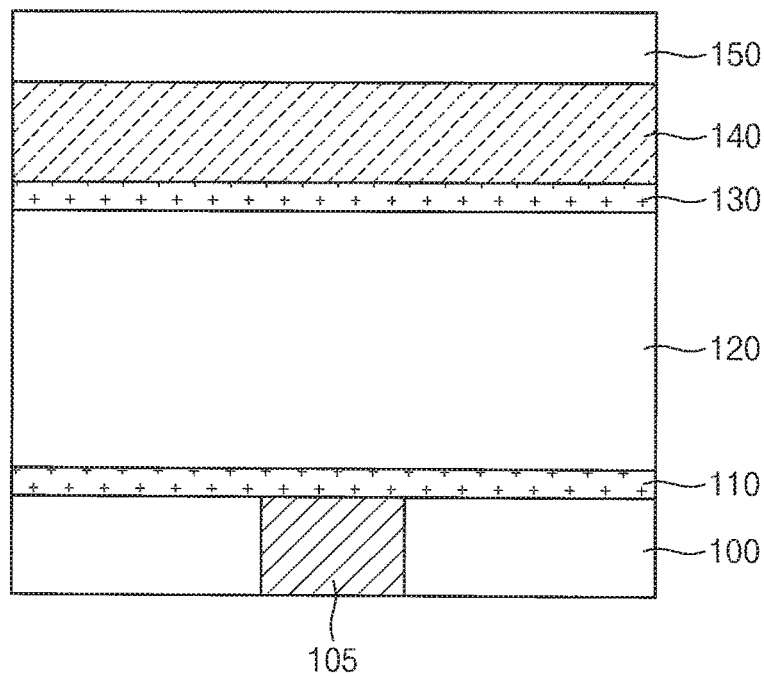

Referring to FIG. 2, an interlayer insulating layer 120, a second etch stop layer 130, a first hard mask layer 140 and a first upper mask layer 150 may be formed, for example sequentially formed, on the first etch stop layer 110.

The interlayer insulating layer 120 may include silicon oxide or organic oxide material having a low dielectric constant. For example, the interlayer insulating layer 120 may include a TEOS-based (TEOS is tetraethyl orthosilicate) silicon oxide, or an oxide based resin material such as silsesquioxane or polysiloxane containing alkyl substituent. The interlayer insulating layer 120 may be formed by a CVD process or a spin coating process.

The second etch stop layer 130 may be formed of or include a nitride material substantially similar to or the same as the first etch stop layer 110. The second etch stop layer 130 may be formed by a CVD process, an ALB process and a sputtering process. The first hard mask layer 140 may be formed of or include, for example, a silicon based material or a carbon based spin-on hardmask. The first upper mask layer 150 may be formed of or include a photo-resist material. The first upper mask layer 150 may further include an antireflective coating layer formed using a bottom anti-reflective coating (BARC) composition.

Figure 3:
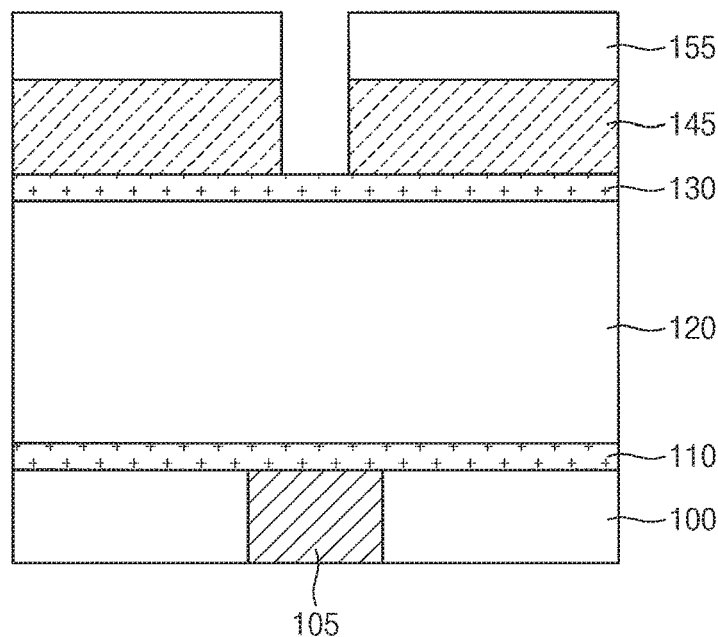

Referring to FIG. 3, the first upper mask layer 150 may be partially removed through a photolithography and etching process to form a first upper mask 155. Next, the first hard mask layer 140 may be partially etched using the first upper mask 155 as an etch mask to form a first hard mask 145.

Accordingly, a hole partially exposing a top surface of the second etch stop layer may be formed in the first upper mask 155 and the first hard mask 145.

Figure 4:
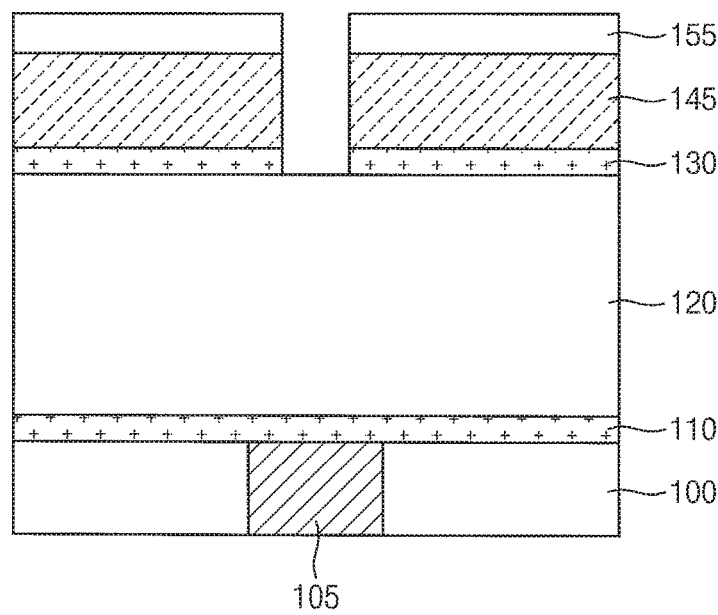

Referring to FIG. 4, a portion of the second etch stop layer 130 exposed through the first upper mask 155 and the first hard mask 145 may be removed. Accordingly, a top surface of the second interlayer insulating layer 120 may be partially exposed through the hole.

Figure 5:
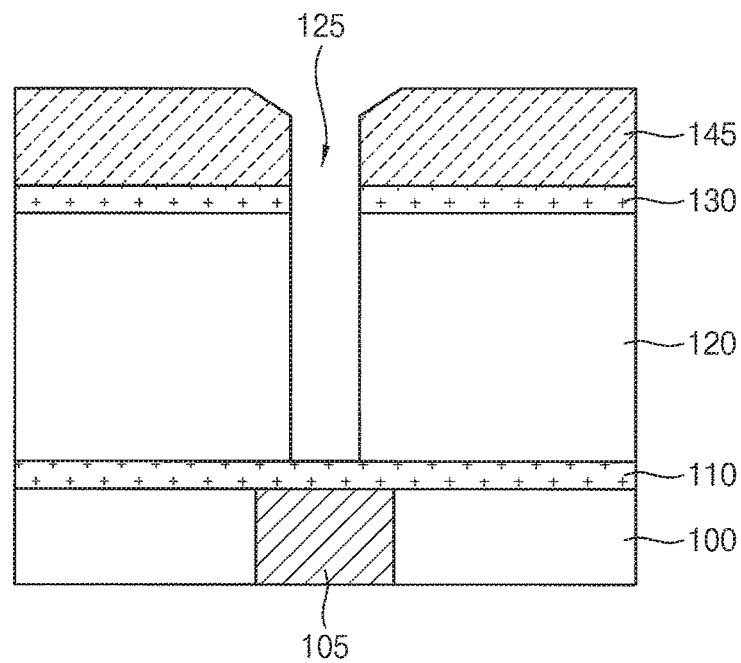

Referring to FIG. 5, the second interlayer insulating layer 120 may be partially removed by a dry etching process using the first hard mask 145. A preliminary via-hole 125 may be formed penetrating the second interlayer insulating layer 120 by the dry etching process. A top surface of the first etch stop layer 110 may be exposed through the preliminary via-hole 125.

In some example embodiments, the first upper mask 155 may be removed during the dry etching process. In addition, a portion of the first hard mask 145 adjacent to the preliminary via-hole 125 may be also removed.

Figure 6:
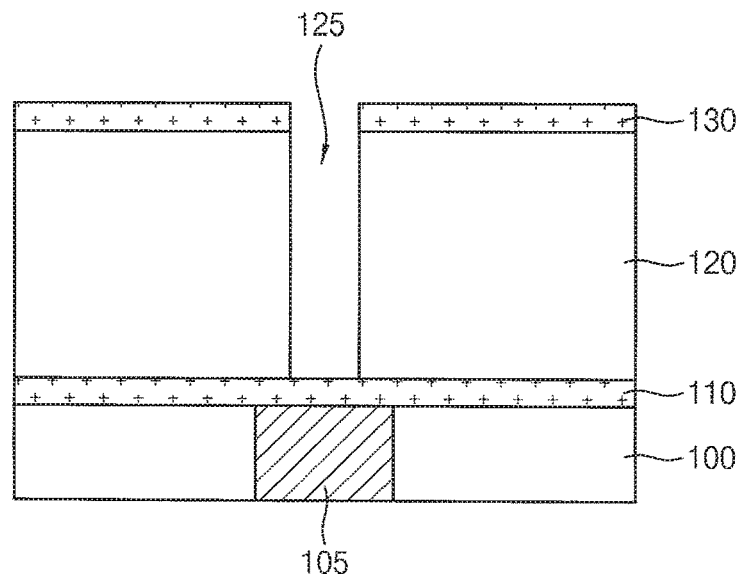

Referring to FIG. 6, the first hard mask 145 may be removed, for example, using an ashing process and/or a strip process.

Figure 7:
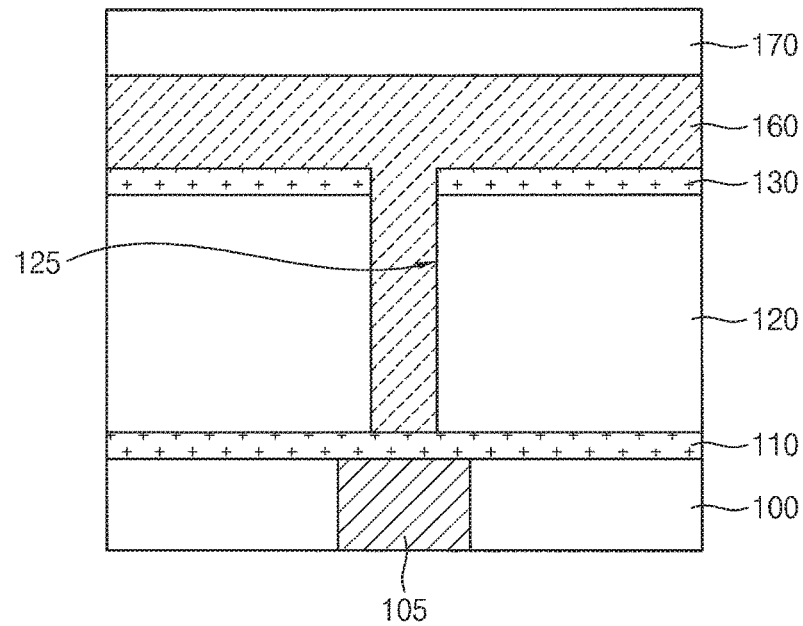

Referring to FIG. 7, a second hard mask layer 160 may be formed on the second etch stop layer 130 to fully fill the preliminary via-hole 125. A second upper mask layer 170 may be formed on the second hard mask layer 160.

The second hard mask layer 160 and the second upper mask layer 170 may be formed using the same materials as the first hard mask layer 140 and the first upper mask layer 150, respectively. The second hard mask layer 160 and the second upper mask layer 170 may be formed by a spin coating process.

Figure 8:
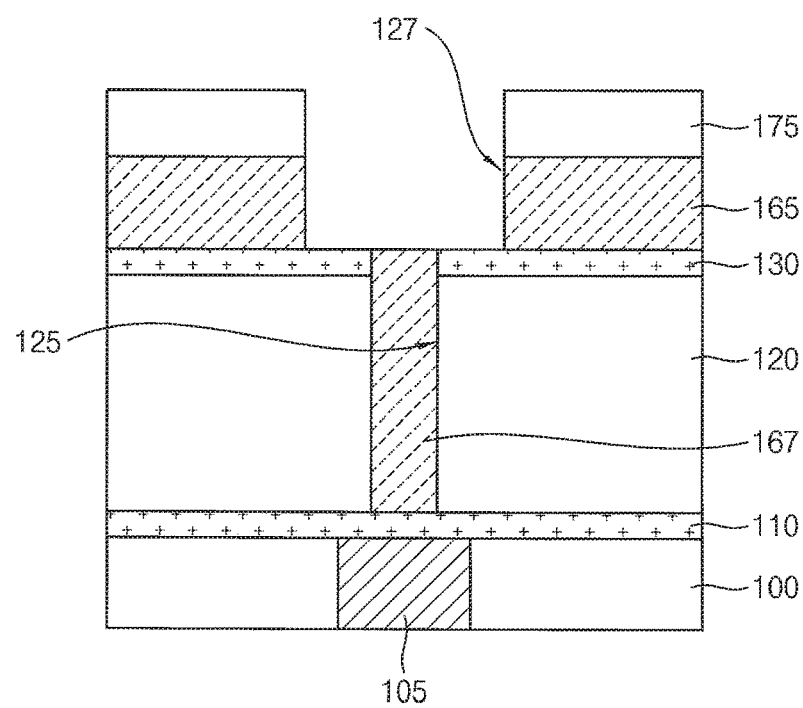

Referring to FIG. 8, the second upper mask layer 170 may be partially removed through a photolithography and etching process to form a second upper mask 175. The second hard mask layer 160 may be partially etched through the second upper mask 175 to form a second hard mask 165.

A preliminary trench 127 may be formed penetrating through the second upper mask 175 and the second hard mask 165. When viewed in a plan view, the preliminary trench may include the preliminary via-hole, and may extend in one direction.

A top surface of the second etch stop layer 130 may be exposed by the preliminary trench. A sacrificial pattern 167 may be formed in the preliminary via-hole 125.

Figure 9:
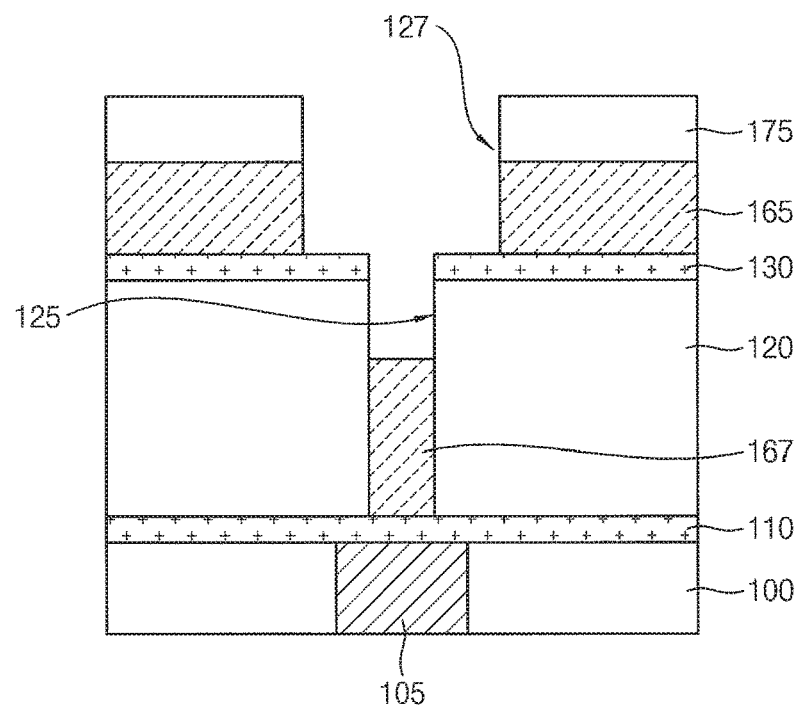

Referring to FIG. 9, an upper portion of the sacrificial pattern 167 may be partially removed, for example, by an etch-back process using the second upper mask 175 and the second hard mask 165 as an etching mask.

Referring to HG. 10, the interlayer insulating layer 120 may be partially removed by a dry etching process using the second hard mask 165 as an etch mask. The preliminary trench 127 may extend into the interlayer insulating layer 120, thereby forming a trench 129. During the dry etching process to remove a portion of the interlayer insulating layer 120, the second upper mask 175 may be also removed together.

The dry etching process may be performed until a top surface of the sacrificial pattern 167 is exposed through a bottom surface of the trench 129. In some example embodiments, the bottom surface of the trench 129 may be located at substantially the same level as the top surface of the sacrificial pattern 167.

As shown in 10, the trench 129 and an upper portion of the preliminary via-hole 125 may be merged with each other. A remaining lower portion of the preliminary via-hole 125 may be defined as a via-hole 125*a*, and the sacrificial pattern 167 may remain within the via-hole 125*a*.

Figure 10:
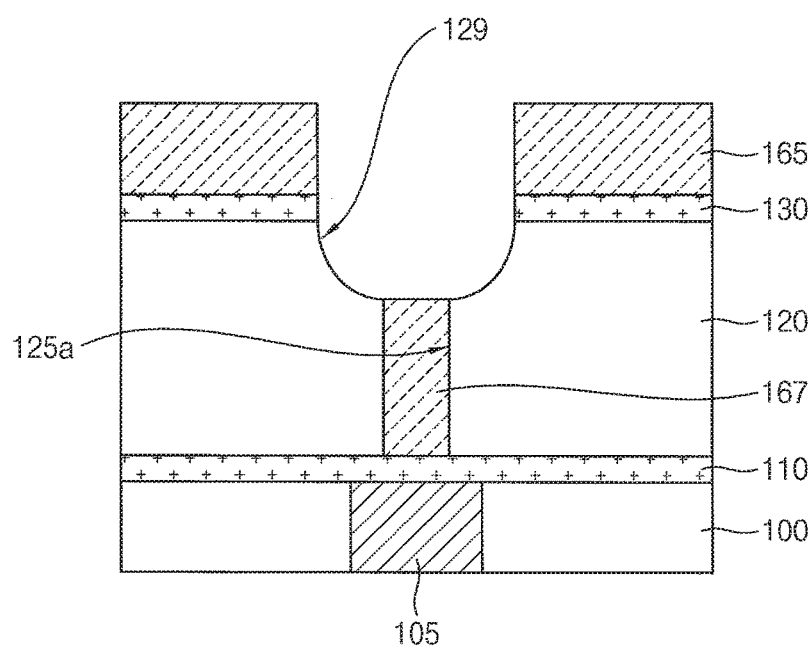

As described in accordance with FIGS. 9 and 10, a height of the via-hole 125*a* may be determined depending on an amount that the upper portion of the sacrificial pattern 167 is removed. For example, the sacrificial pattern 167 may be provided with a guide pattern to determine the height of the via-hole 125*a*.

Figure 11:
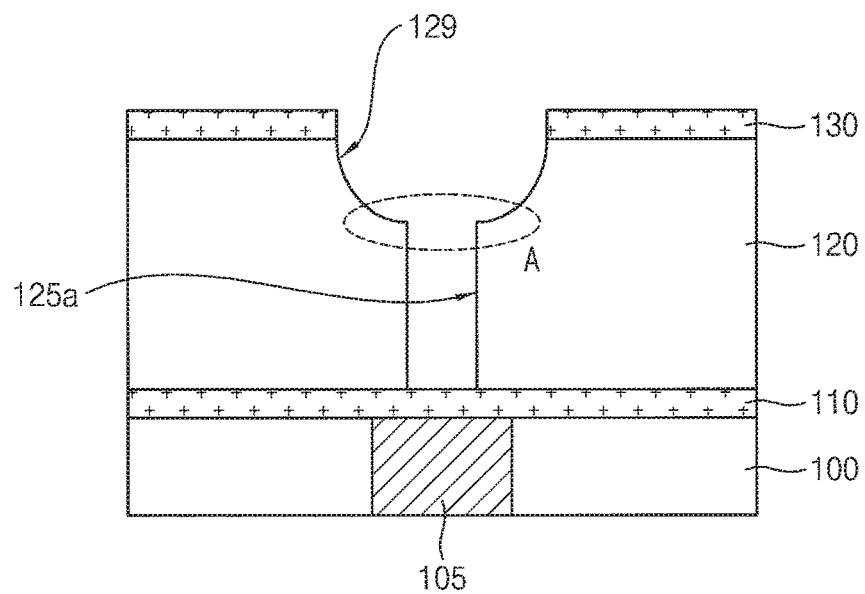

Referring to FIG. 11, the second hard mask 165 and the sacrificial pattern 167 may be removed by an asking process and/or a strip process.

As described above, the second hard mask 165 and the sacrificial pattern 167 may be formed from the second hard mask layer 160. Accordingly, the second hard mask 165 and the sacrificial pattern 167 may be the same material, and may be contemporaneously removed, or removed at the same time.

The trench 129 and the via-hole 125*a* may be merged to communicate with each other by removing the sacrificial pattern 167. The trench 129 may be connected to an upper portion of the via-hole, and may extend in one direction.

As indicated by "A" in FIG. 11, a contact area may be defined as a portion where the trench and the via-hole are contact with each other.

Figure 12:
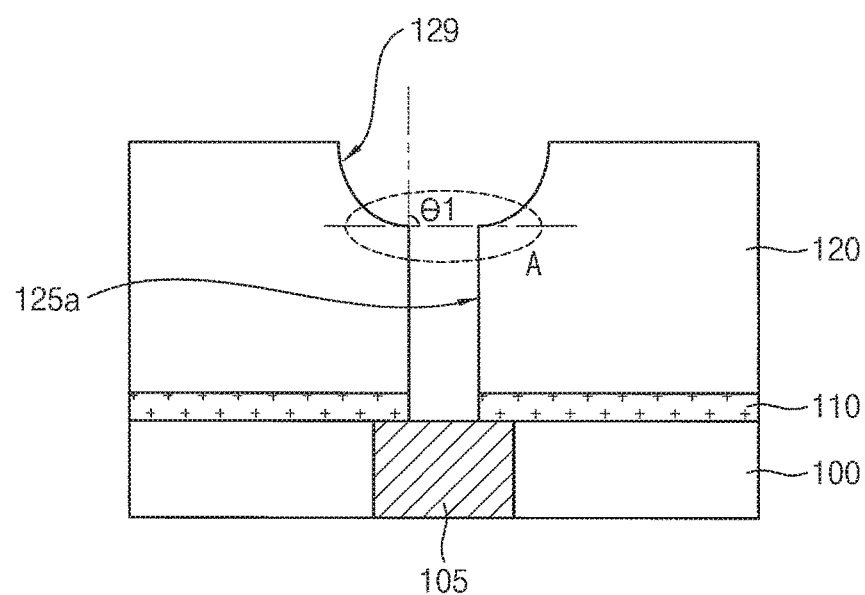

Referring to FIG. 12, an exposed portion of the first etch stop layer 110 through the second etch stop layer 130 and the via-hole 125*a* may be removed by a dry etching process. The dry etching process (hereinafter, it refers to a nitride etching process) may be performed with an etch condition having a high selectivity with respect to a nitride material.

In some example embodiments, the second etch stop layer 130 and the exposed portion of the first etch stop layer 110 may be removed together by the nitride etching process.

An etching gas used for etching the nitride materials may include a first fluorine-containing gas and a nitride etching-facilitating gas. The first fluorine-containing gas may include a fluorocarbon gas, for example, tetrafluoromethane ($CF_4$) and/or trifluoromethane ($CHF_3$). The nitride etching-facilitating gas may include, for example, a nitrogen ($N_2$) gas.

For example, the nitride etching-facilitating gas may be first absorbed on the first and second etch stop layers 110 and 130 including the nitride material, and may react with the first fluorine-containing gas with an affinity. The first and second etch stop layers 110 and 130 may be etched by the interaction of the nitride etching-facilitating gas and the first fluorine-containing gas without etch damage to the interlayer insulating layer 120 including the oxide material.

In some example embodiments, the etching gas may further include an etching assist gas such as an oxygen ($O_2$) gas.

When the first etch stop layer 110 may be etched by the nitride etching process, a width of a lower portion of the via-hole 125*a* may be hindered or prevented from being increased by etching damage. In addition, the height of the via-hole 125a may be hindered or prevented from being decreased during the nitride etching process.

The first etch stop layer 110 may be partially removed to expose a top surface of the lower wiring 105 through the via-hole 125a.

In some example embodiments, after performing the nitride etching process, a plasma treatment may be further performed to remove an etching residue. The plasma treatment may be performed using nitrogen and/or hydrogen as reaction gases.

Figure 13:
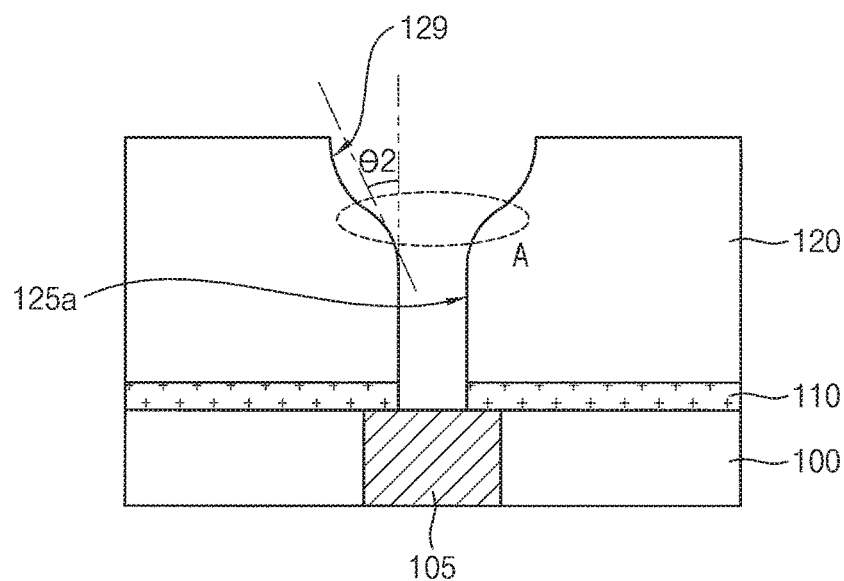

Referring to FIG. 13, a dry etching process (hereinafter, it refers to an oxide etching process) having a high etch selectivity with respect to an oxide material may be performed to partially remove the interlayer insulating layer 120 in the trench 129 and/or the via-hole 125a.

According to some example embodiments, a portion of the interlayer insulating layer 120 of the contact area A may be removed by the oxide etching process. For example, a protruding portion protruded from the contact area A may be removed by the oxide etching process. Accordingly, a contact angle of the contact area A may be reduced. The contact angle may be defined as an angle formed by the intersection of a sidewall of the via-hole 125a and a bottom surface of the trench 129.

For example, as indicated by "Θ1" in FIG. 12, the contact angle may be substantially close to or at ninety degrees. As indicated by "Θ2" in FIG. 13, after etching the protruding portion of the contact area A, the contact angle may be reduced.

An etching gas used for etching the oxide materials may include a second fluorine-containing gas and an oxide etching-facilitating gas. The second fluorine-containing gas may include a fluorocarbon gas. In some example embodiments, the second fluorine-containing gas may include a fluorocarbon having a higher proportion of carbon than the first fluorine-containing gas. For example, the second fluorine-containing gas may include hexafluorobutadiene ($C_4F_6$). The oxide etching-facilitating gas may include, for example, carbon monoxide (CO) and/or carbon dioxide ($CO_2$)

For example, the oxide etching-facilitating gas may be first absorbed on the interlayer insulating layer 120 including the oxide material, and may react with the second fluorine-containing gas with an affinity. The contact area A may be etched by the interaction of the oxide etching-facilitating gas and the second fluorine-containing gas without etch damage to the first etch stop layer 110 including the nitride material.

Furthermore, the second fluorine-containing gas used in the oxide etching process may reduce an etch rate than the nitride etching process, because the second fluorine-containing gas includes the fluorocarbon with relatively high proportion of carbon. Accordingly, the trench 129 and/or the via-hole may be hindered or prevented from being damaged by excessively etching a portion of the interlayer insulating layer except for the protruding portion of the contact area A.

In some example embodiments, the etching gas may further include an etching assist gas such as an oxygen ($O_2$) gas.

Figure 14:
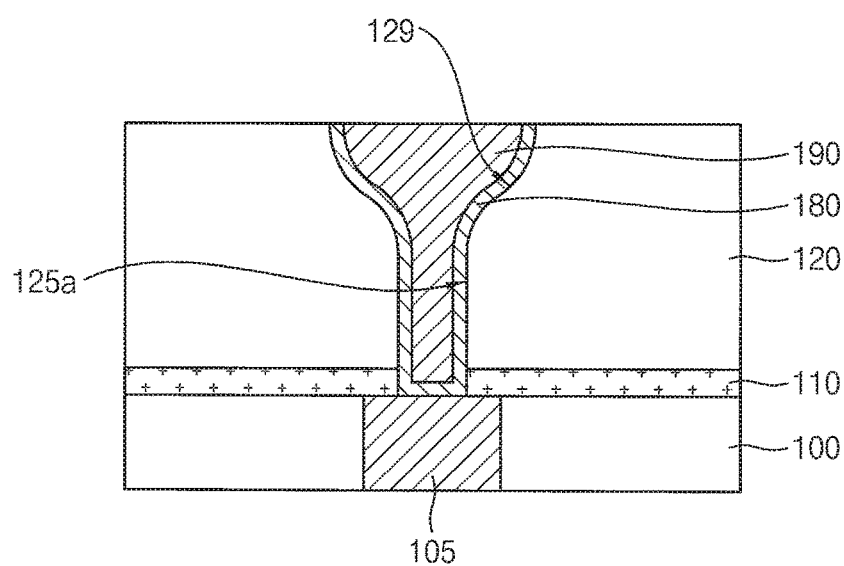

Referring to FIG. 14, an upper wiring may be formed in the trench 129 and the via-hole 125a to be electrically connected to the lower wiring 105. The upper wiring may include a barrier conductive pattern 180 and a metal pattern 190.

For example, the barrier conductive layer may be conformally formed on the top surface of the interlayer insulating layer 120, and sidewalls and bottom surfaces of the trench 129 and the via-hole 125a. The barrier conductive layer may include titanium, titanium nitride, tantalum and/or tantalum nitride. The barrier conductive layer may be formed by a PVD process or an ALB process. In some example embodiments, the barrier conductive layer may include a chemically stable metal such as rubidium and cobalt by a CVD process.

Next, a metal layer may be formed on the barrier conductive layer to fill the trench 129 and the via-hole 125a. In some example embodiments, a seed layer may be formed on the barrier conductive layer by a PVD process using a copper metal target, or a copper reflow process. Next, a metal layer may be formed on the copper seed layer by electroplating.

Next, portions of the metal layer and the barrier conductive layer may be removed to expose the top surface of the interlayer insulating layer 120 by a chemical mechanical polishing (CMP) process. Accordingly, the barrier conductive pattern 180 and the metal pattern 190 may be formed on inner walls of the via-hole 125a and the trench 129.

As described in accordance with FIG. 13, due to a decrease of the contact angle of the contact area A, the via-hole 125a may be filled with the metal layer and the barrier conductive layer. Accordingly, a high-reliability upper wiring may be formed with few or no defect such as void, crack and seam in an inside thereof.

Figure 15:
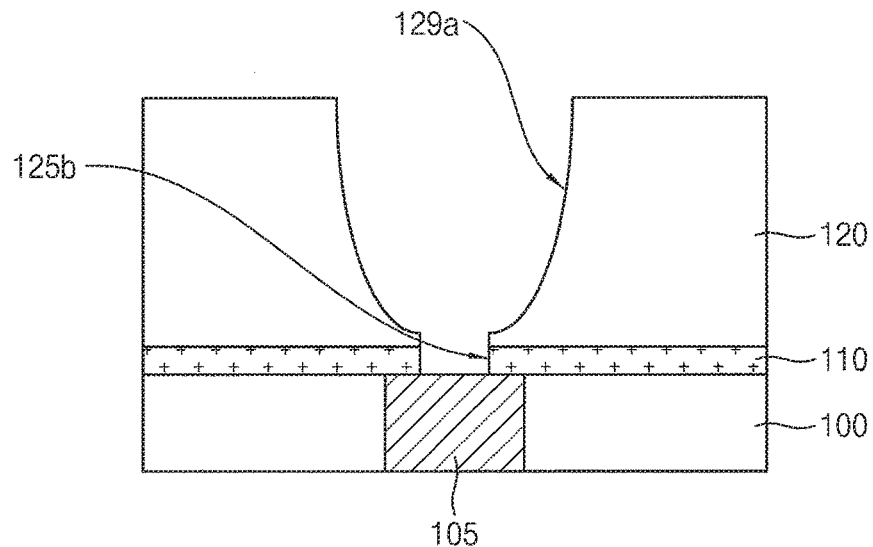
FIGS. 15 and 16 are cross-sectional views illustrating a method of fabricating a wiring structure for a semiconductor device according to comparative examples.
Figure 16:
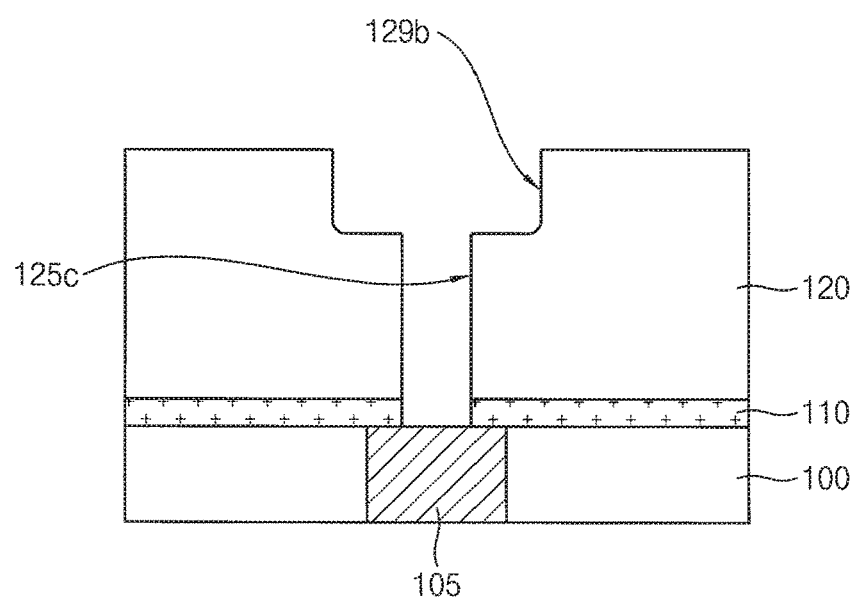

FIGS. 15 and 16 are cross-sectional views illustrating a method of fabricating a wiring structure for a semiconductor device according to comparative examples.

Referring to FIG. 15, a via-hole 125b and a trench 129a may form a conductive pattern electrically connected to a lower wiring 105. It may be advantageous to lower a height of the via-hole 125b to fill a conductive material therein for forming the conductive pattern.

However, as shown in FIG. 15, if the height of the via-hole 125b is excessively decreased, the via-hole 125b may be damaged during etching of a etch stop layer 110. Accordingly, it may be difficult to secure a desired critical dimension. In addition, when a plurality of via-holes 125b are formed, dimensional uniformity of the via-holes 125b may be worsened.

Referring to FIG. 16, if the height of a via-hole 125c is increased, it may be advantageous to secure a fine critical dimension and dimensional uniformity. However, as shown in FIG. 16, as the height of the via-hole 125c is increased, it may be difficult to fill a conductive material in the via-hole 125c for forming a conductive pattern. In addition, as a contact angle formed by a trench 129b and the via-hole 125c is increased, a detect may be generated during the filling of the via-hole 125c.

However, according to some example embodiments of the inventive concepts, a desired, or alternatively predetermined height of the via-hole 125a may be secured in advance by the sacrificial pattern 167. Accordingly, the via-holes 125a may have uniform critical dimension. In addition, a filling characteristic of the metal in the via-hole 125a and/or trench 129 may be improved by reducing the contact angle by the oxide etching process.

Accordingly, a high-reliability upper wiring may be formed with uniform critical dimension and few or no defect such as void, crack and seam in an inside thereof.

FIGS. 17 to 22 are cross-sectional views illustrating a method of fabricating a wiring structure for a semiconductor device according to some example embodiments of the inventive concepts. In some example embodiments, the detail description of parts similar to or repeated with that described with reference to FIGS. 1 to 14 will be omitted, and the difference will be described in detail.

Figure 17:
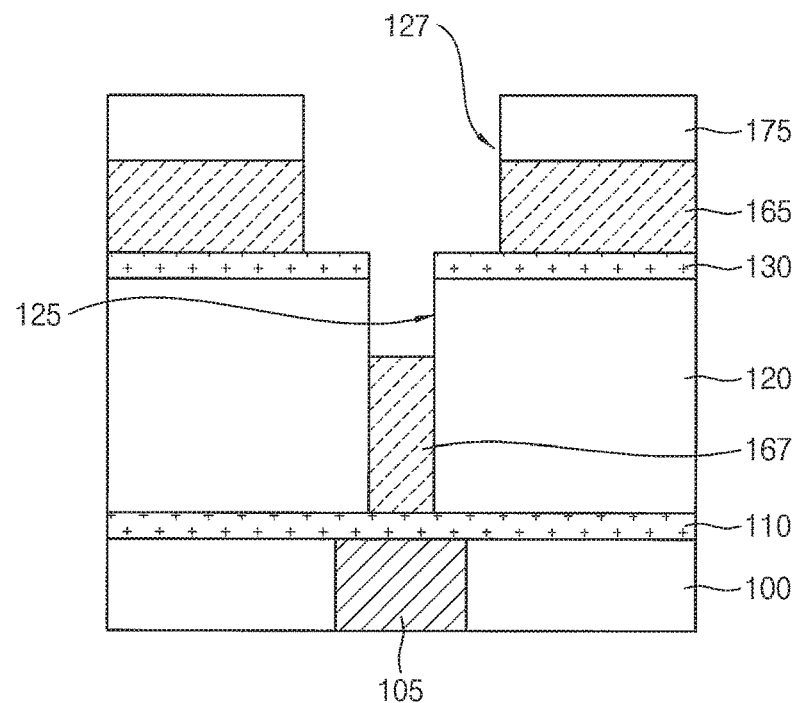
FIGS. 17 to 22 are cross-sectional views illustrating a method of fabricating a wiring structure for a semiconductor device according to some example embodiments of the inventive concepts.

Referring to FIG. 17, processes substantially similar to or the same as the processes described with reference to FIGS. 1 to 9 may be performed.

According to some example embodiments, a first etch stop layer 110, an interlayer insulating layer 120 and a second etch stop layer 130 may be formed, for example sequentially formed on a lower wiring 105 and a lower insulating layer 100. A preliminary via-hole 125 may be formed penetrating through the second etch stop layer 130 and the interlayer insulating layer 120.

A second upper mask 175 and a second hard mask 165 in which a preliminary trench 127 is formed, may be formed on the second etch stop layer 130. A sacrificial pattern 167 may be formed in the preliminary via-hole 125, and an upper portion of the sacrificial pattern 167 may be partially removed.

Figure 18:
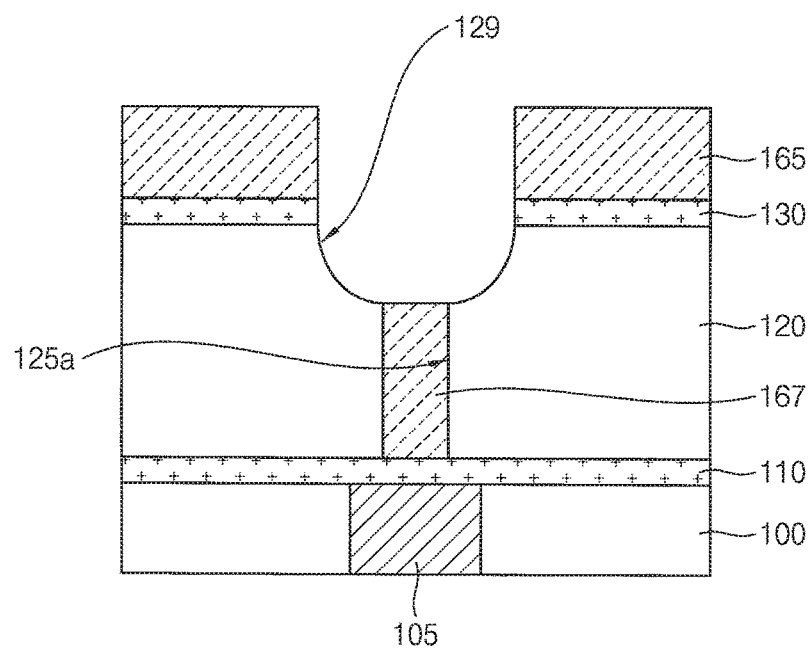

Referring to FIG. 18, a process substantially similar to or the same as the process described with reference to FIG. 10 may be performed.

According to some example embodiments, an upper portion of the interlayer insulating layer 120 may be etched through the preliminary trench 127 to form a trench 129. By merging an upper portion of the preliminary via-hole 125 with the trench 129, a via-hole 125a may be formed. The via-hole 125a may be filled with the sacrificial pattern 167. A bottom surface of the trench 129 may be located at substantially the same level as a top surface of the sacrificial pattern 167.

Figure 19:
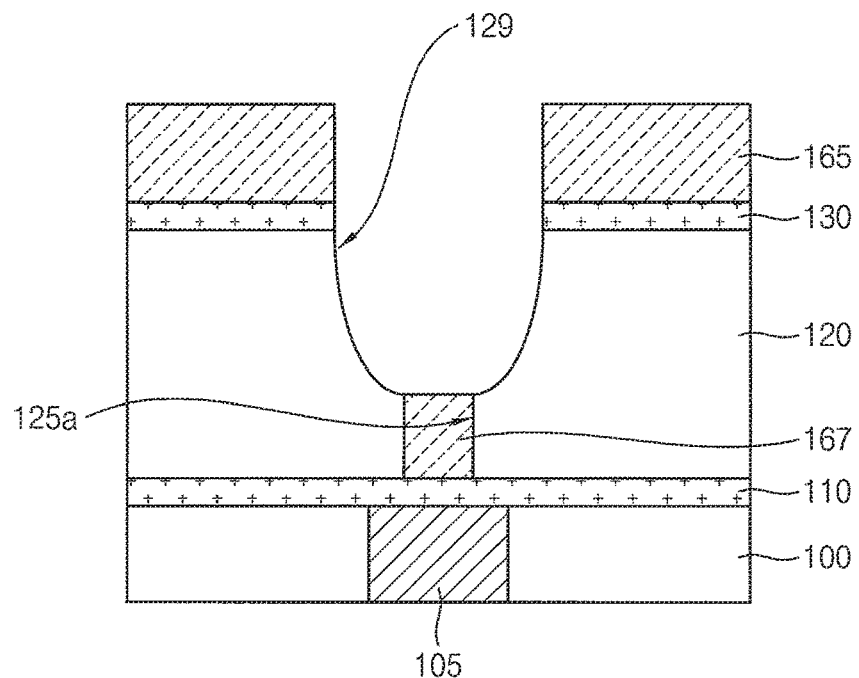

Referring to FIG. 19, a depth of the trench 129 may be increased by an additional dry etching process. A height of the via-hole 125a may be reduced by the additional dry etching process. During the additional dry etching process, an upper portion of the sacrificial pattern 167 may be also removed.

Figure 20:
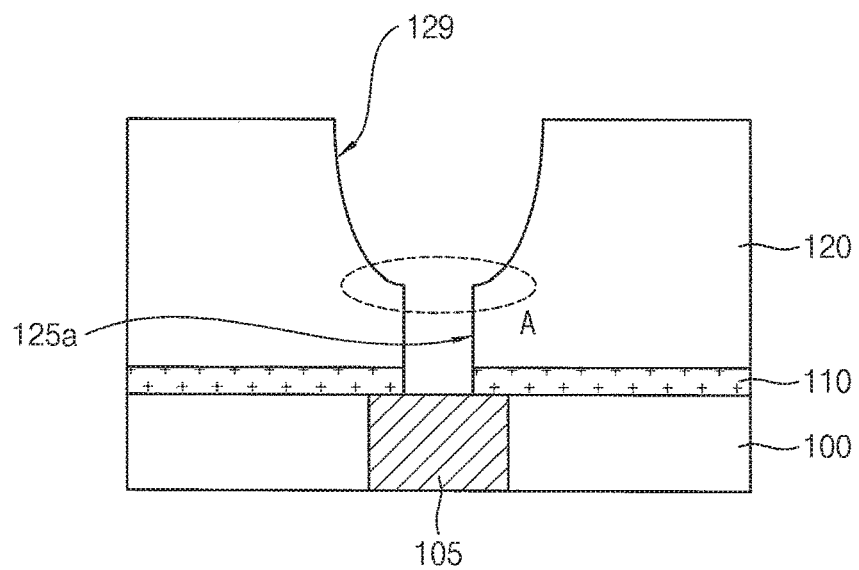

Referring to FIG. 20, processes substantially similar to or the same as the processes described with reference to FIGS. 11 and 12 may be performed.

According to some example embodiments, the second hard mask 165 and the sacrificial pattern 167 may be removed by an ashing process and/or a strip process. A portion of the first etch stop layer 110 exposed through the via-hole 125a may be etched by the nitride etching process described above.

The via-hole 125a and the trench 129 may be merged or communicated with each other through a contact area A.

Figure 21:
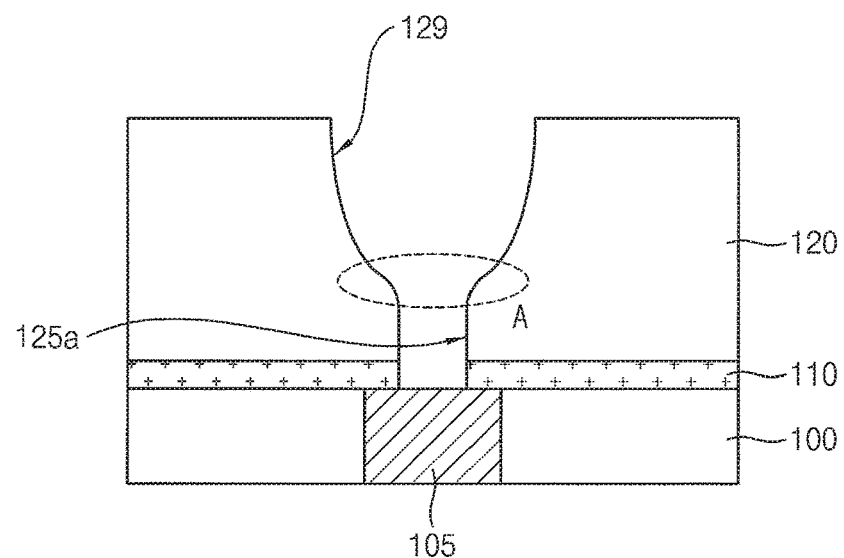

Referring to FIG. 21, a process substantially similar to or the same as the process described with reference to FIG. 13 may be performed.

According to some example embodiments, inner walls of the trench 129 and/or the via-hole 125a may be partially etched by the oxide etching process described above. A contact angle formed by the trench 129 and the via-hole 125a may be reduced by removing a portion of the contact area A by the oxide etching process.

Figure 22:
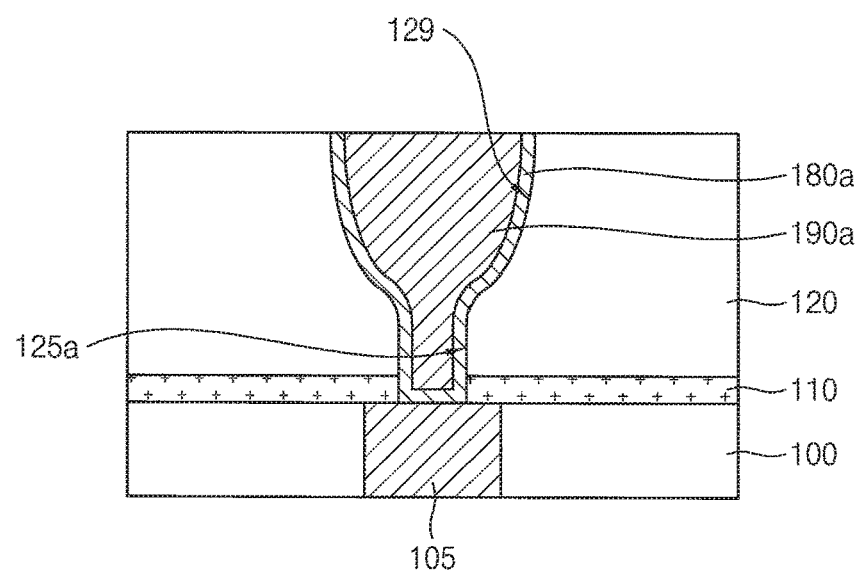

Referring to FIG. 22, an upper wiring may be formed in a manner substantially similar to or the same as the process described with reference to FIG. 14. The upper wiring may be connected to the lower wiring 105, and may include a barrier conductive pattern 180a and a metal pattern 190a.

According to some example embodiments described above, the height of the via-hole 125a may be preliminarily determined by the sacrificial pattern 167. In addition, the height of the via-hole 125a may be decrease by the additional dry etching process. Accordingly, a filling characteristic of the metal pattern 190a in the via-hole 125a and/or trench 129 may be improved in combination with the oxide etching process, and the upper wiring may be formed with few or no defect such as void, crack and seam in an inside thereof.

Figure 23:
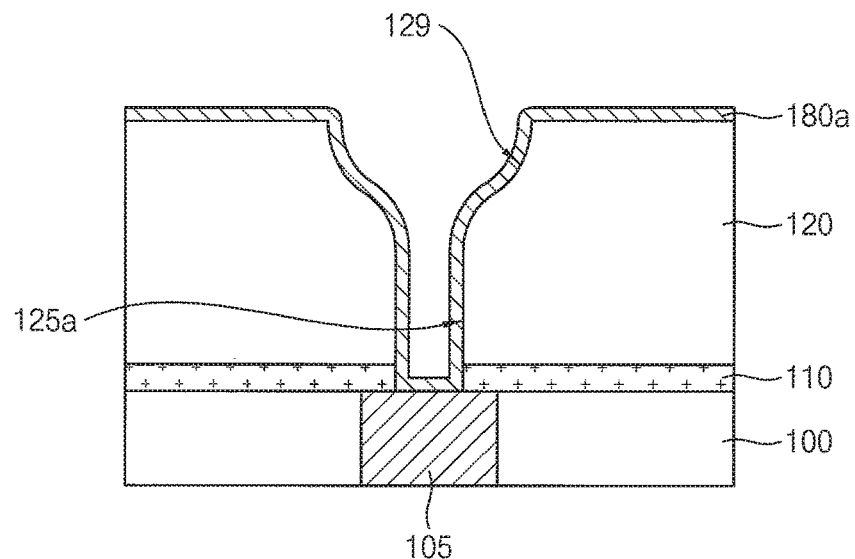
FIGS. 23 to 25 are cross-sectional views illustrating a method of fabricating a wiring structure for a semiconductor device according to some example embodiments of the inventive concepts.
Figure 24:
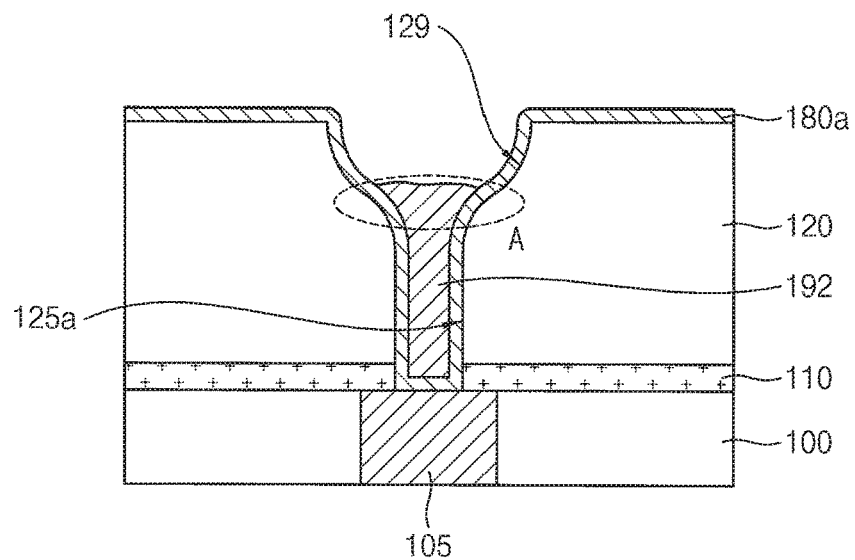
Figure 25:
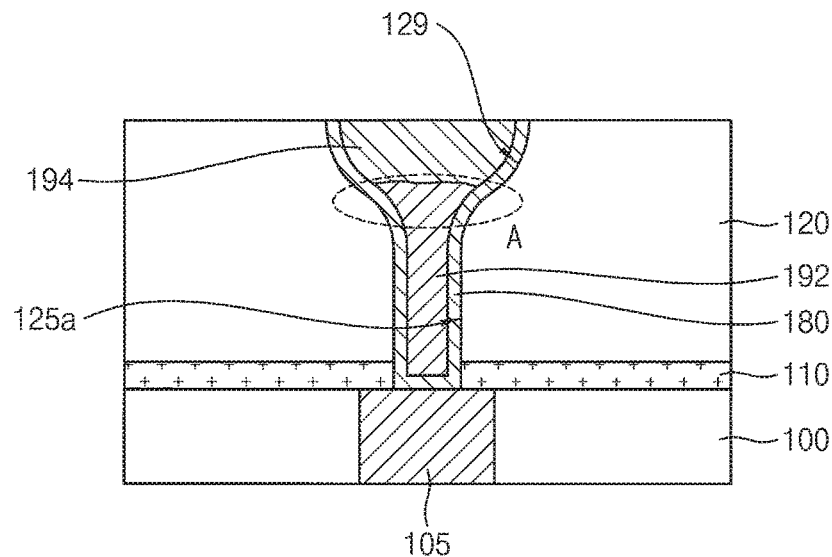

FIGS. 23 to 25 are cross-sectional views illustrating a method of fabricating a wiring structure for a semiconductor device according to some example embodiments of the inventive concepts. For example, FIGS. 23 to 25 show processes of forming an upper wiring in a via-hole 125a and a trench 129.

Referring to FIG. 23, processes substantially similar to or the same as the processes described with reference to FIGS. 1 to 13 may be performed. Accordingly, a trench 129 and a via-hole 125a may be formed in an interlayer insulating layer 120. The trench 129 and the via-hole 125a may penetrate a first etch stop layer 110 to expose a lower wiring 105.

Next, a barrier conductive layer 180a may be formed along a top surface of the interlayer insulating layer 120 and a sidewall and a bottom surface of the trench 129 and the via hole 125a. The barrier conductive layer 180a may not only hinder or prevent metal-diffusion from entering the interlayer insulating layer 120, but also improve wettability for forming a seed layer 192 (see in FIG. 24).

Referring to FIG. 24, the seed layer 192 may fill the via-hole 125a. As described with reference to FIG. 13, a contact angle formed by the trench 129 and the via-hole 125a may be reduced by the oxide etching process. Accordingly, a gap-fill characteristic may be improved.

According to some example embodiments, the seed layer may be filled in the via-hole 125a, and may extend to a bottom surface of the trench 129.

Referring to FIG. 25, a metal fill pattern 194 and a conductive barrier pattern 180 may be formed in the trench 129. The metal fill pattern 194 may be grown from the seed layer 192 by a copper plating process.

For example, a metal fill layer may be formed on the barrier conductive layer 180a to fully fill the trench 129. The metal fill layer and the barrier conductive layer 180a may be planarized until a top surface of the interlayer insulating layer is exposed, thereby forming the metal fill pattern 194 and the conductive barrier pattern 180 remaining in the trench 129. The metal fill layer and the barrier conductive layer 180a may be planarized using a chemical mechanical polishing (CMP) process or an etch-back process.

Because the seed layer is filled in the via-hole 125a, and extends to a bottom surface of the trench 129, the trench 129 may be easily filled with the metal fill layer. Accordingly, the metal fill pattern 194 may be formed with few or no internal defect such as void, crack.

FIGS. 26 to 33 are cross-sectional views illustrating a method of fabricating a wiring structure for a semiconductor device according to some example embodiments of the inventive concepts. In some example embodiments, the detail description of parts similar to or repeated with that described with reference to FIGS. 1 to 14 will be omitted, and the difference will be described in detail.

Figure 26:
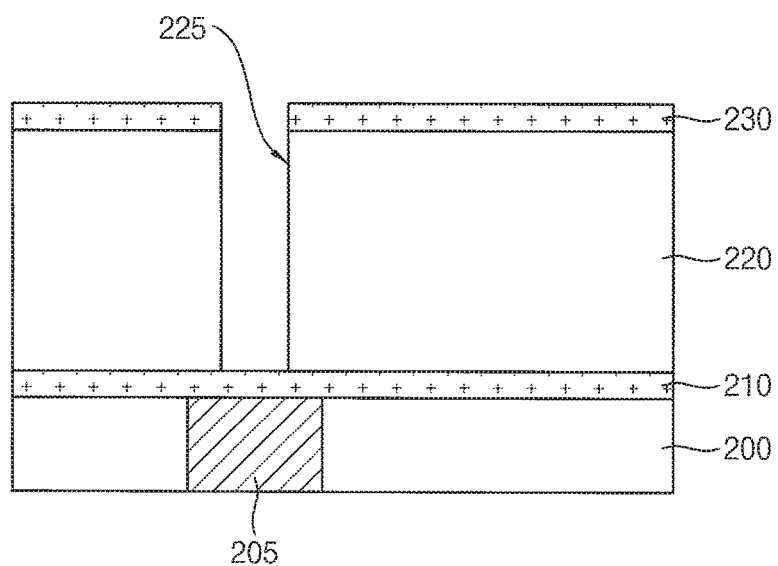
FIGS. 26 to 33 are cross-sectional views illustrating a method of fabricating a wiring structure for a semiconductor device according to some example embodiments of the inventive concepts.

Referring to FIG. 26, processes substantially similar to or the same as the processes described with reference to FIGS. 1 to 6 may be performed.

According to some example embodiments, a first etch stop layer 210, an interlayer insulating layer 220 and a second etch stop layer 230 may be formed, for example sequentially formed on a lower wiring 205 and a lower insulating layer 200. A preliminary via-hole 225 may be formed penetrating through the second etch stop layer 230 and the interlayer insulating layer 220. A top surface of the first etch stop layer 210 may be exposed through the preliminary via-hole 225.

Figure 27:
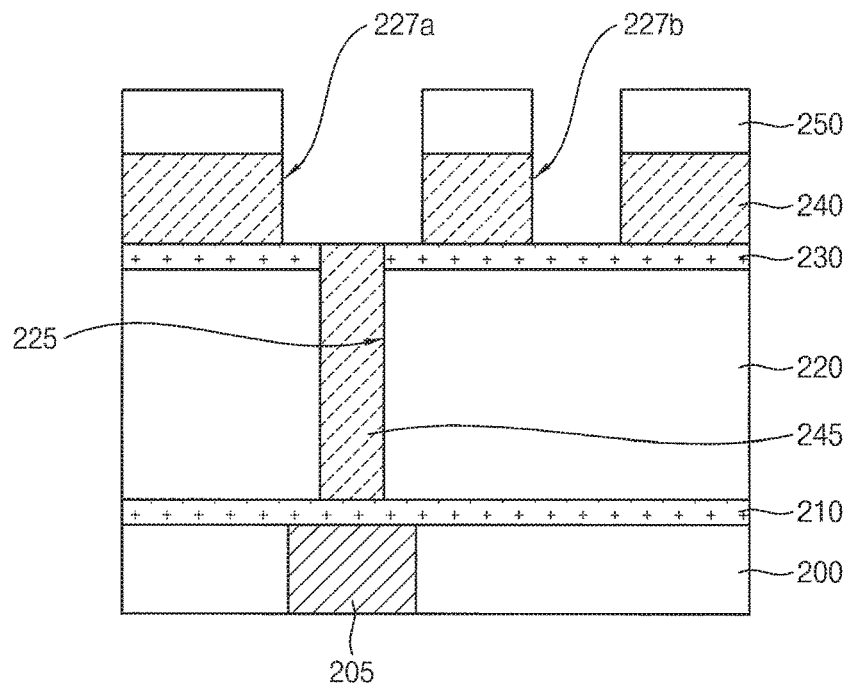

Referring to FIG. 27, processes substantially similar to or the same as the processes described with reference to FIGS. 7 and 8 may be performed.

According to some example embodiments, a second hard mask layer may be formed on the second etch stop layer 230 to fully fill the preliminary via-hole 225. A second upper mask layer may be formed on the second hard mask layer. The second upper mask layer and the second hard mask layer may be patterned to form a second upper mask 250 and a second hard mask 240, respectively. The second upper mask 250 and the second hard mask 240 may include a first preliminary trench 227a and a second preliminary trench 227b therein.

The first preliminary trench 227a may overlap the preliminary via-hole 225. The second preliminary trench 227b may be spaced apart from the preliminary via-hole 225. In addition, a sacrificial pattern 245 may be formed in the preliminary via-hole 225.

Figure 28:
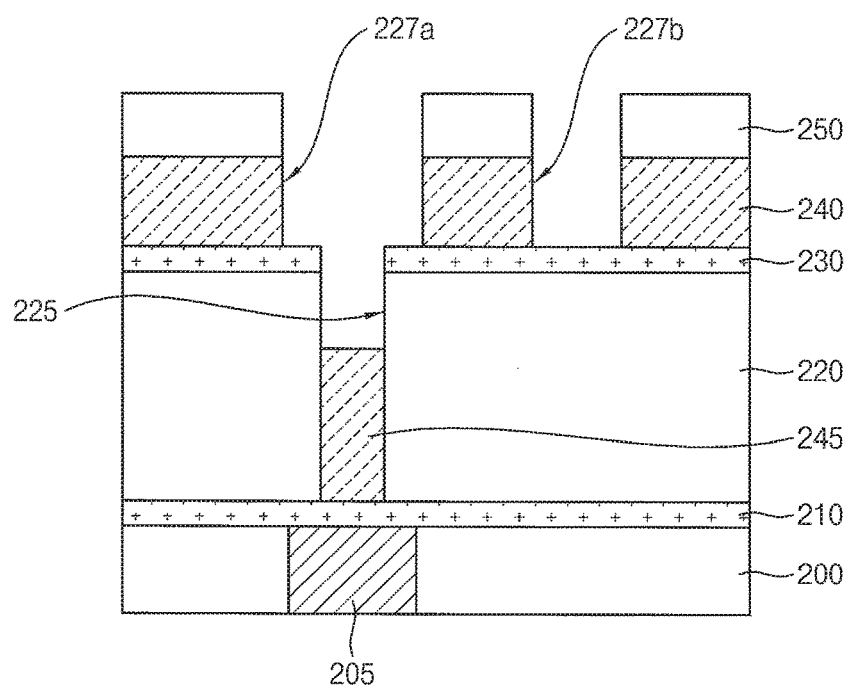

Referring to FIG. 28, as described with reference to FIG. 9, an etch-back process may be performed to remove an upper portion of the sacrificial pattern 245.

Figure 29:
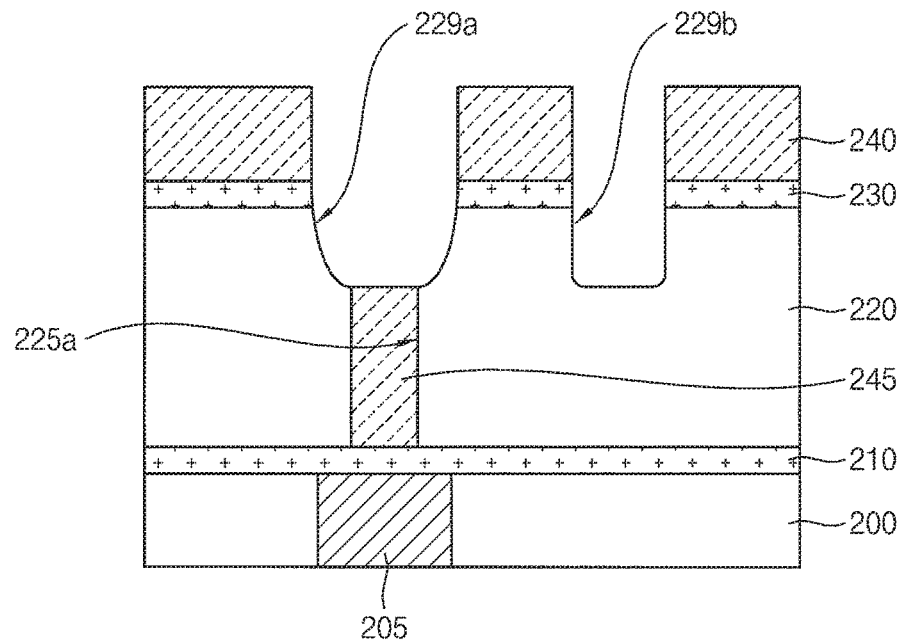

Referring to FIG. 29, as described with reference to FIG. 10, the interlayer insulating layer 220 may be partially removed by a dry etching process using the second hard mask 240. The first preliminary trench 227a and the second preliminary trench 227b may extend into the interlayer insulating layer 220, thereby forming a first trench 229a and a second trench 229b, respectively.

According to some example embodiments, the first trench 229a may be merged with an upper portion of the preliminary via-hole 225, and a top surface of the sacrificial pattern 245 may be exposed through a bottom surface of the first trench 229a. In addition, a remaining lower portion of the preliminary via-hole 225 may be defined as a via-hole 225a.

In some example embodiments, as described with reference to FIG. 19, a depth of the first trench 229a may be increased by an additional dry etching process. Accordingly, a height of the sacrificial pattern 245 and the via-hole 225a may be decreased by the additional dry etching process.

Figure 30:
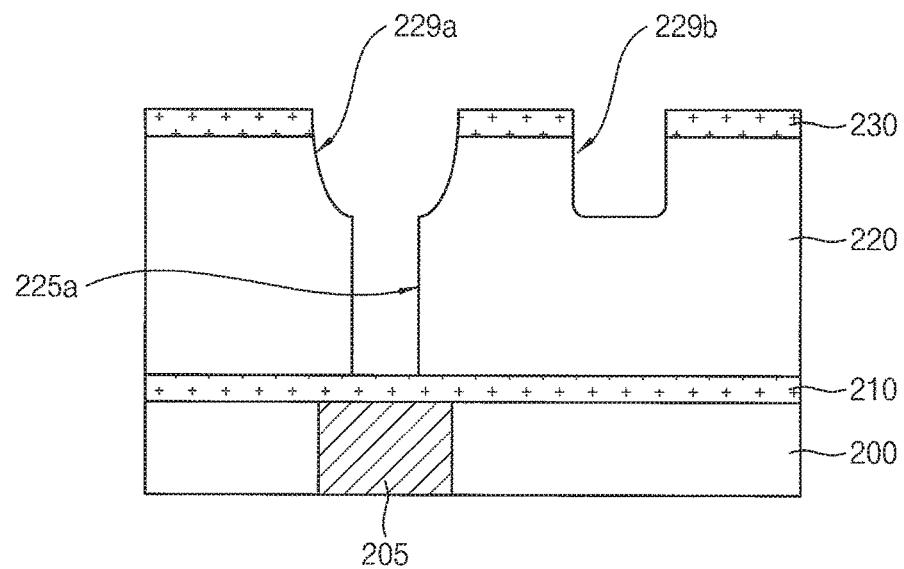

Referring to FIG. 30, the sacrificial pattern 245 remaining within the via-hole 225a may be removed in a manner substantially similar to or the same as the process described with reference to FIG. 10.

The first trench 229a and the via-hole 225a may be merged to communicate with each other by removing the sacrificial pattern 245.

Figure 31:
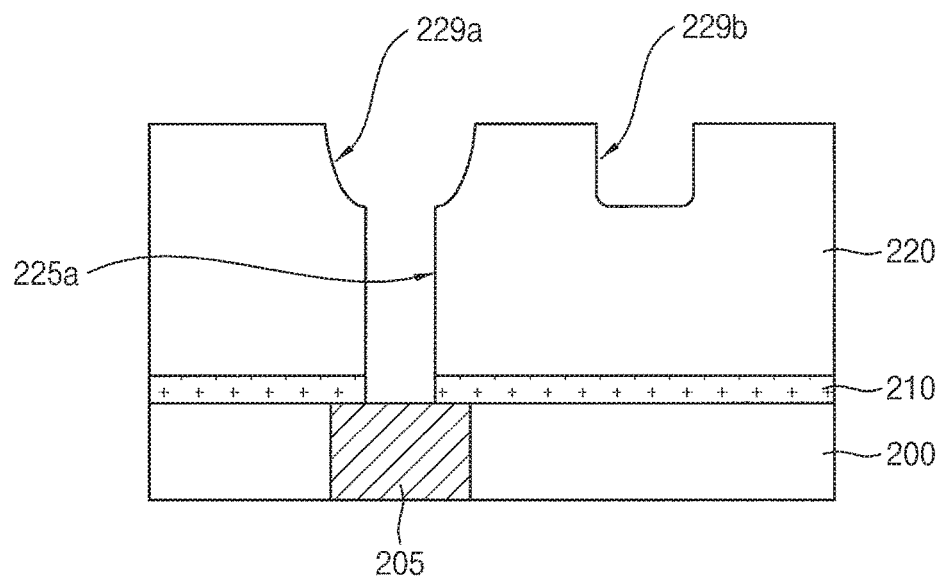

Referring to FIG. 31, a process substantially similar to or the same as the process described with reference to FIG. 12 may be performed.

According to some example embodiments, an exposed portion of the first etch stop layer 210 through the via-hole 225a may be removed by a nitride etching process described above. The second etch stop layer 230 and the exposed portion of the first etch stop layer 110 may be removed together by the nitride etching process. Accordingly, a top surface of the lower wiring 205 may be exposed through the via-hole 225a.

Figure 32:
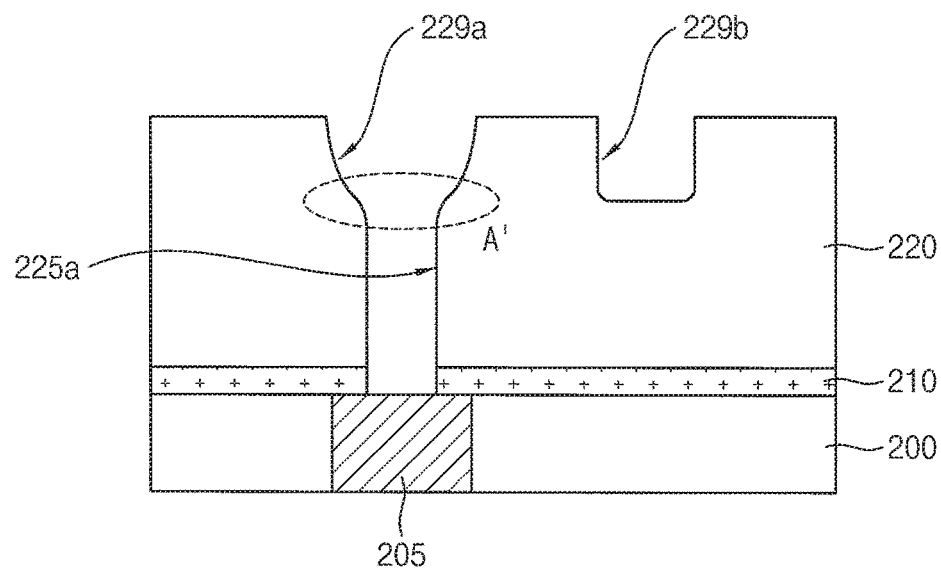

Referring to FIG. 32, as described with reference to FIG. 13 a contact area A of the first trench 229a and the via-hole 225a may be partially etched to reduce a contact angle.

In some example embodiments, a depth of the second trench 229b may be also increased by the oxide etching process.

Figure 33:
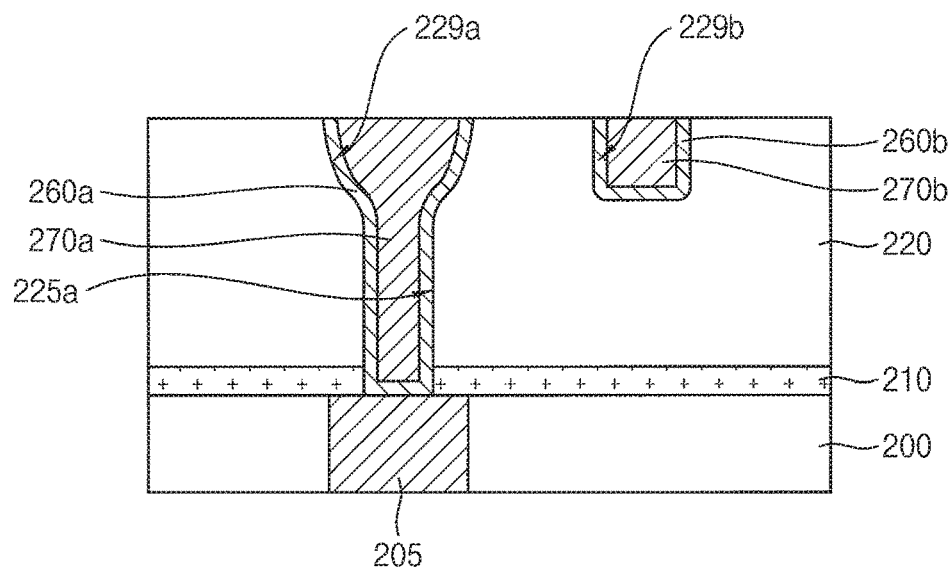

Referring to FIG. 33, an upper wiring may be formed in a manner substantially similar to or the same as the processes described with reference to FIG. 14 or 23 to 25.

As shown in FIG. 33, a first upper wiring may be formed in the first trench 229a and the via-hole 225a to be electrically connected to the lower wiring 205. The first upper wiring may include a first barrier conductive pattern 260a and a first metal pattern 270a. A second upper wiring may be formed in the second trench 229b. The second upper wiring may include a second barrier conductive pattern 260b and a second metal pattern 270b.

The first upper wiring may be electrically connected to the lower wiring 205. The second upper wiring may be buried in the interlayer insulating layer 220, and may extend in one direction.

According to some example embodiments, the first metal pattern 270a and the second metal pattern 270b may be formed at the same time, thereby promoting filling the first trench 129a with metal. For example, the second metal pattern 270b may be served as a plating guide to form the first metal pattern 270a.

FIGS. 34 to 39 are cross-sectional views illustrating a method of fabricating a wiring structure for a semiconductor device according to some example embodiments of the inventive concepts. In some example embodiments, the detail description of parts similar to or repeated with parts described with reference to FIGS. 1 to 14 will be omitted, and the differences will be described in detail.

Figure 34:
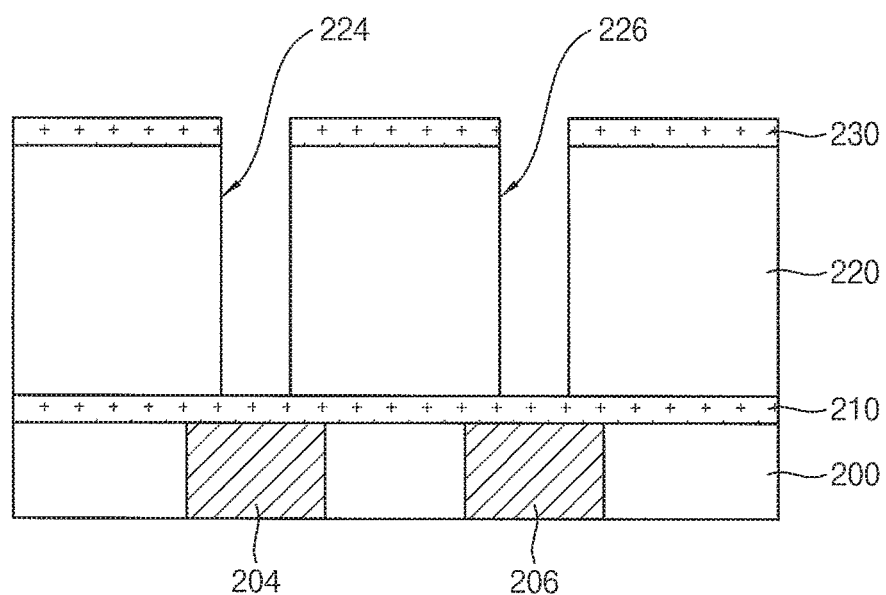
FIGS. 34 to 39 are cross-sectional views illustrating a method of fabricating a wiring structure for a semiconductor device according to some example embodiments of the inventive concepts.

Referring to FIG. 34, processes substantially similar to or the same as the processes described with reference to FIGS. 1 to 6 may be performed.

According to some example embodiments, a first etch stop layer 210 may be formed on a first lower wiring 204, a second lower wiring 206 and a lower insulating layer 200. An interlayer insulating layer 220 and a second etch stop layer 230 may be formed on the first etch stop layer 210. A first preliminary via-hole 224 and a second preliminary via-hole 226 may be formed through the second etch stop layer 230 and the interlayer insulating layer 220 to expose a top surface of the first etch stop layer 210.

Figure 35:
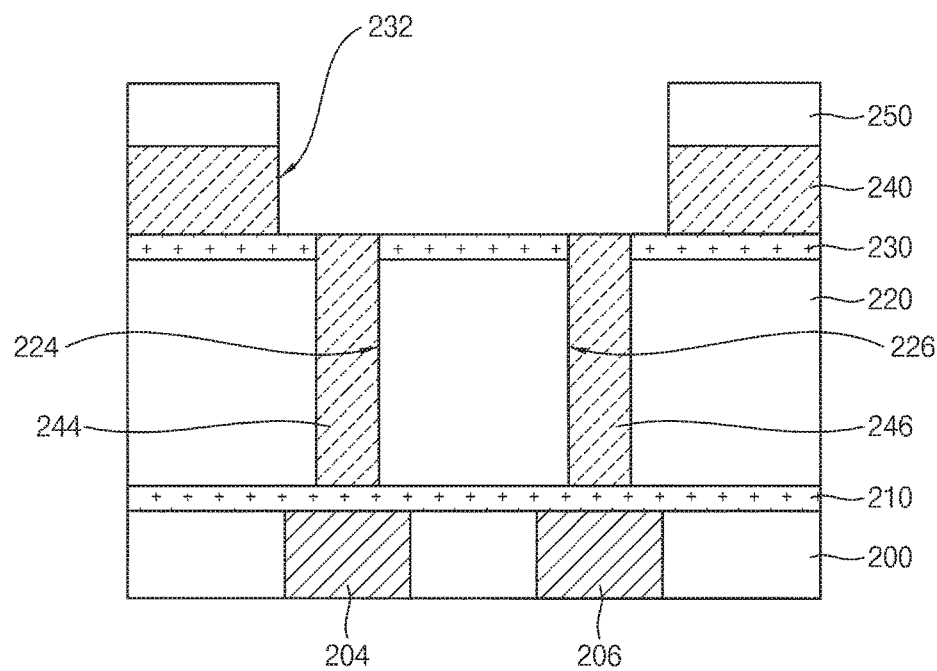

Referring to FIG. 35, processes substantially similar to or the same as the processes described with reference to FIGS. 7 and 8 may be performed.

According to some example embodiments, a second hard mask layer may be formed on the second etch stop layer 230 to fill the first and second preliminary via-holes 224 and 226. An upper mask layer may be formed on the second hard mask layer. The second upper mask layer and the second hard mask layer may be patterned to form a second upper mask 250 and a second hard mask 240, respectively. The second upper mask 250 and the second hard mask 240 may include a preliminary trench 232 therein.

A first sacrificial pattern 244 and a second sacrificial pattern 246 may be formed in the first preliminary via-hole 224 and the second preliminary via-hole 226, respectively. The second etch stop layer 230 may be exposed together with top surfaces of the first and second sacrificial patterns 244 and 246 through the preliminary trench 232.

Figure 36:
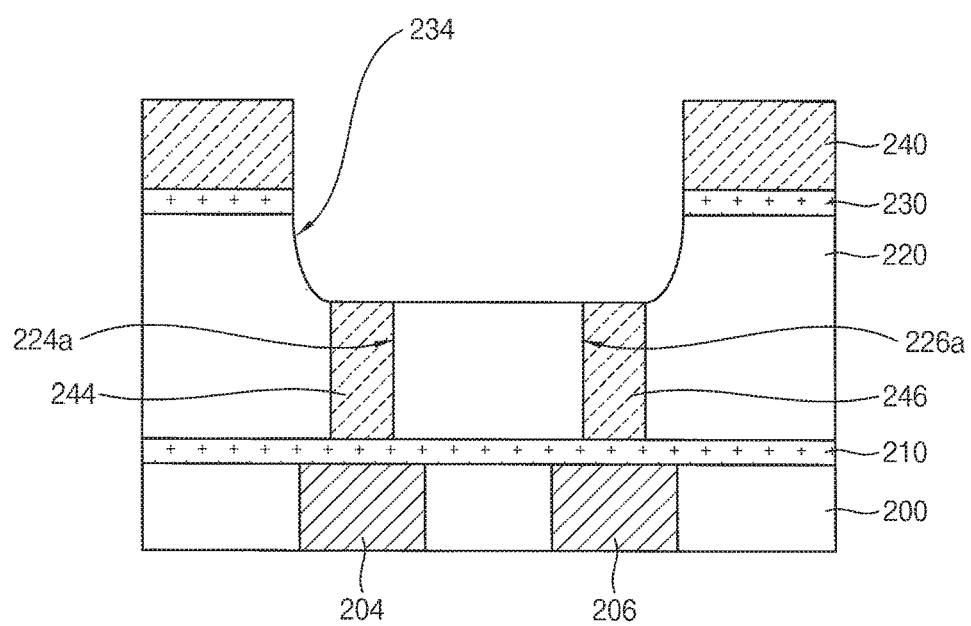

Referring to FIG. 36, processes substantially similar to or the same as the processes described with reference to FIGS. 9 and 10 may be performed.

According to some example embodiments, as described with reference to FIG. 9, an etch-back process may be performed to remove upper portions of the first and second sacrificial patterns 244 and 246. Next, the interlayer insulating layer 220 may be partially removed by a dry etching process using the second hard mask 240. The preliminary trench 232 may extend into the interlayer insulating layer 220, thereby forming a trench 234.

A first via-hole 224a and a second via-hole 226a may be defined by forming the trench 234. The first and second via-holes 224a and 226a may be also filled with the first and second sacrificial patterns 244 and 246. Top surfaces of the first and second sacrificial patterns 244 and 246 may be exposed through the trench 234.

Figure 37:
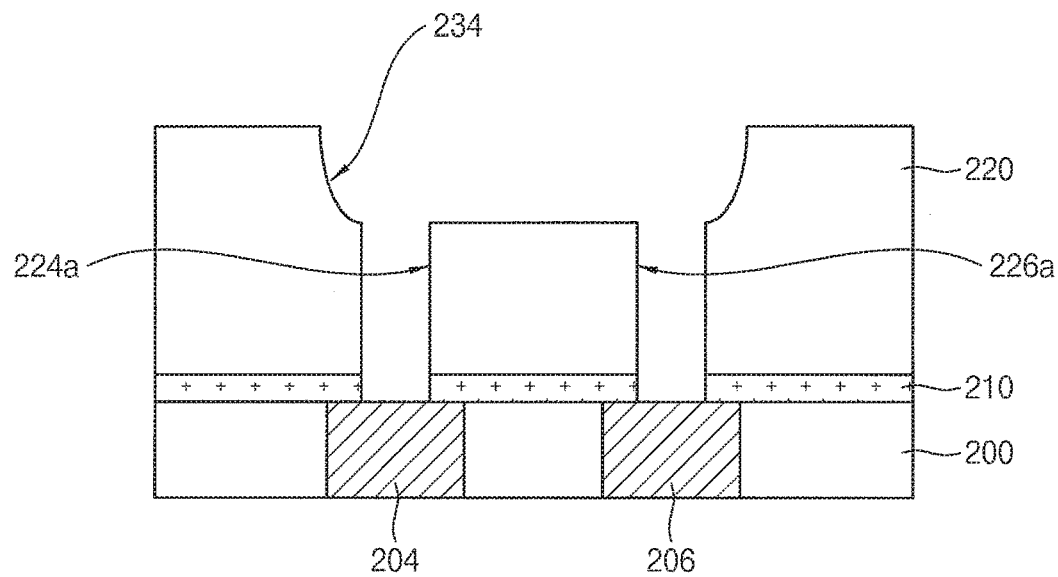

Referring to FIG. 37, as described with reference to FIG. 11, the first and second sacrificial patterns 244 and 246 may be removed. Accordingly, the first and second via-holes 224a and 226a may be merged to communicate with a bottom portion of the trench 234. The second hard mask 240 may be removed together with the first and second sacrificial patterns 244 and 246.

Next, as described with reference to FIG. 12, the first etch stop layer 210 exposed through the first and second via-holes 224a and 226a may be removed during etching the second etch stop layer 230 by the nitride etching process described above. Top surfaces of the first lower wiring 204 and the second lower wiring 206 may be exposed through the first and second via-holes 224a and 226a, respectively.

Figure 38:
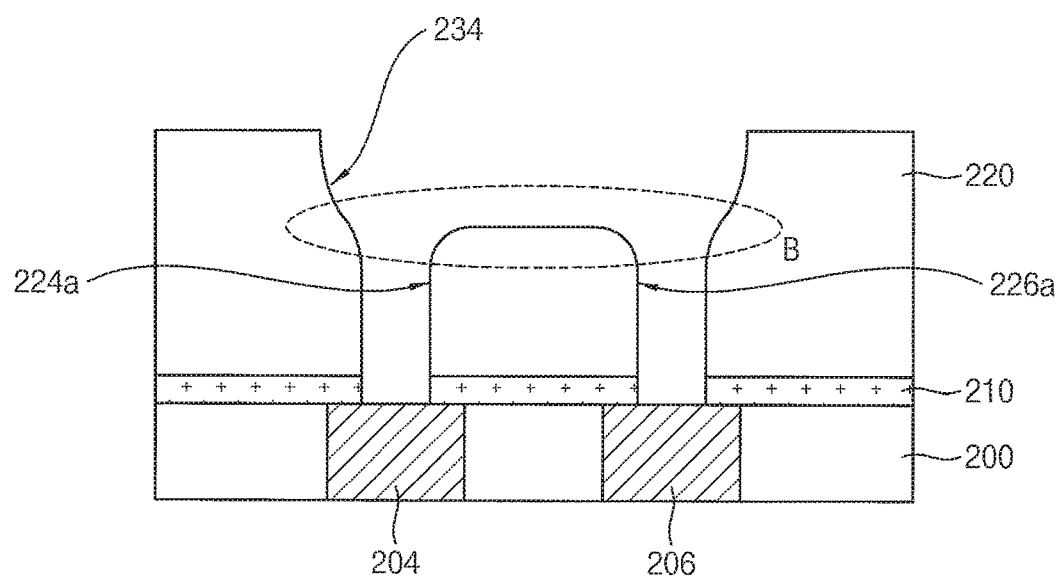

Referring to FIG. 38, process substantially similar to or the same as the process described with reference to FIG. 13 may be performed.

According to some example embodiments, a contact area B in which the first via-hole 224a and a second via-hole 226a are in contact with the trench 234 may be partially etched by a oxide etching process described above. Accordingly, contact angles formed between the trench 234 and the first and second via-holes 224a and 226a may be reduced.

Figure 39:
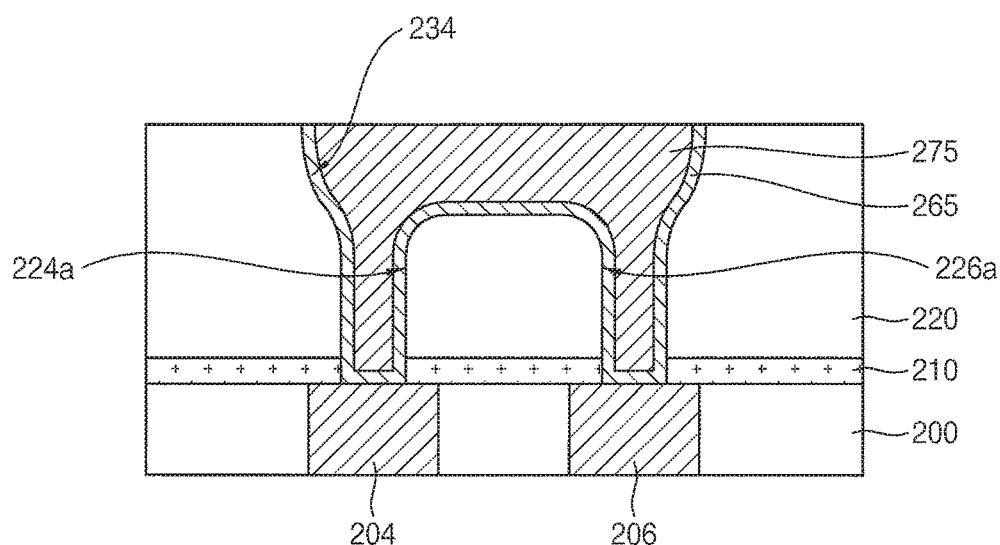

Referring to FIG. 39, an upper wiring may be formed in a manner substantially similar to or the same as the processes described with reference to FIG. 14 or 23 to 25.

An upper wiring may include a barrier conductive pattern 265 and a metal pattern 275. The barrier conductive pattern 265 may be formed along sidewalls and bottom surfaces of the trench 234, the first and second via-holes 224a and 226a. The metal pattern 275 may be formed on the barrier conductive pattern 265 to fill the trench 234 and the first and second via-holes 224a and 226a. The upper wiring may be connected to the first and second lower wirings 204 and 206.

As described above in detail, a filling characteristic of the metal in a plurality of the via-holes and/or trench may be improved by reducing the contact angle by the oxide etching process.

FIGS. 40 to 51 are planar and cross-sectional views illustrating a method of fabricating a semiconductor device according to some example embodiments of the inventive concepts. For example, FIGS. 40 to 51 show a method of fabricating a logic device including a tin field-effect transistor (FinFET).

Figure 40:
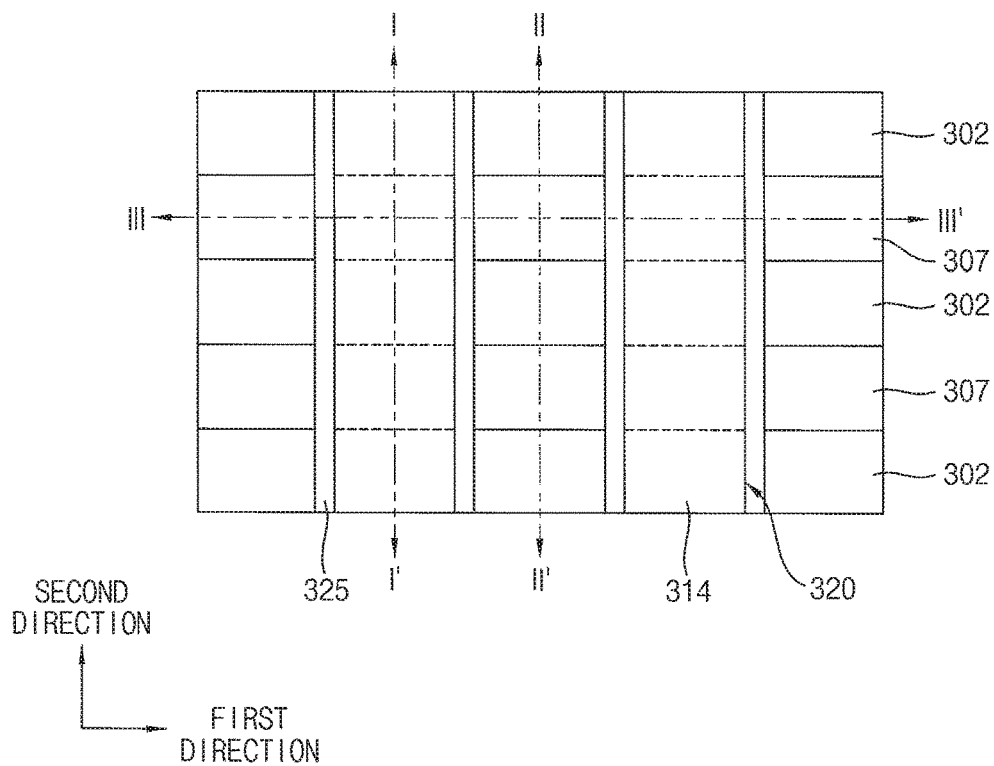
FIGS. 40 to 51 are planar and cross-sectional views illustrating a method of fabricating a semiconductor device according to some example embodiments of the inventive concepts.
Figure 41:
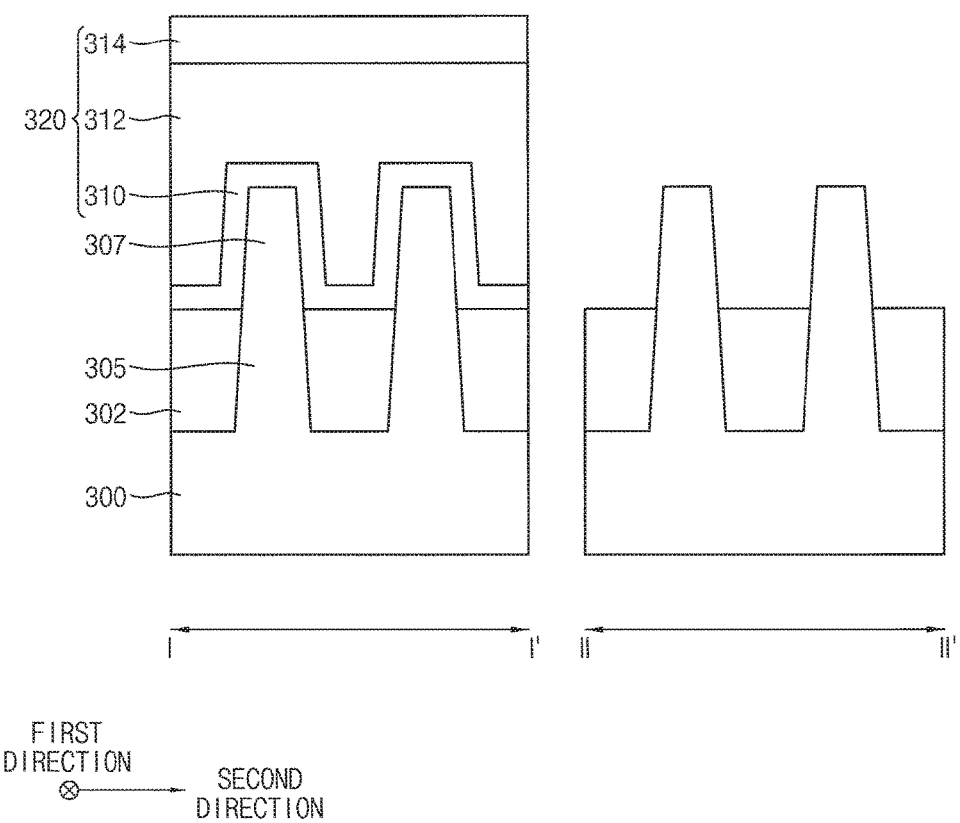

FIG. 40 is a planar view illustrating the fabricating method of the logic device. FIG. 41 is cross-sectional view taken along lines I-I' and II-II' in FIG. 40. FIGS. 42 to 51 are cross-sectional views taken along line III-III' in FIG. 40.

In FIGS. 40 to 51, a first direction and a second direction may be parallel to a top surface of a substrate and be crossing each other. For example, the first direction and the second direction may vertically cross each other. The opposite direction and direction indicated by an arrow in the drawings are considered to be the same direction.

Processes substantially similar to or the same as the processes described with reference to FIGS. 1 to 14 may be performed.

Figure 42:
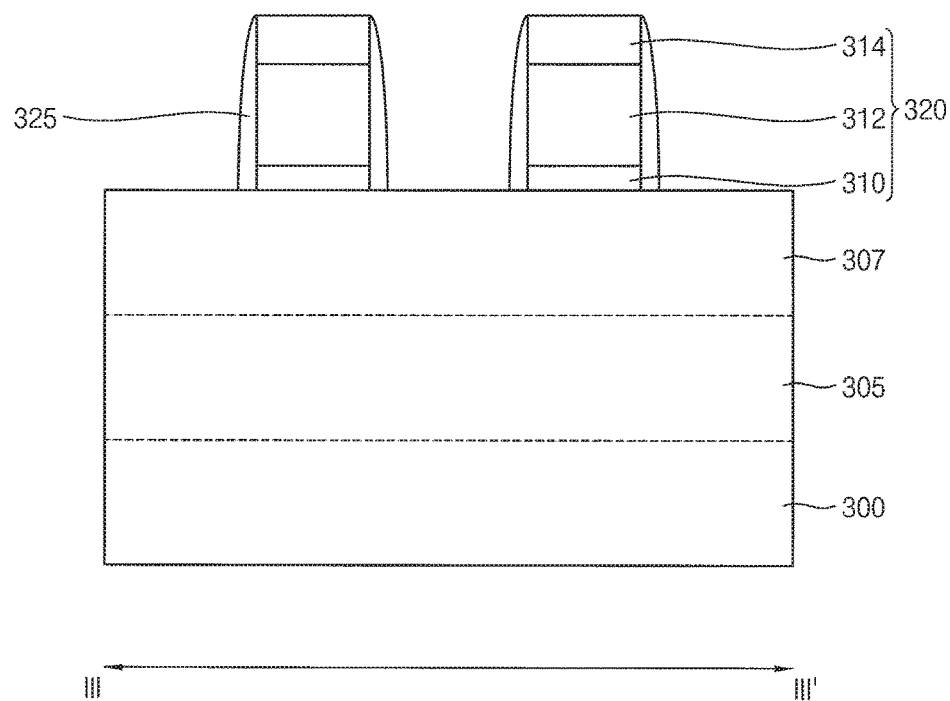

Referring to FIGS. 40 to 42, an active pattern 305 may protrude in a direction substantially perpendicular to a top surface of the substrate 300. A dummy gate structure 320 may cross the active patterns 305 and may extend in a second direction.

The substrate 300 may include semiconductor materials such as silicon, germanium and silicon-germanium, or Group III and Group IV compound semiconductor materials such as GaP, GaAs and GaSb. In some example embodiments, the substrate 300 may include a SOI substrate or a GOI substrate.

The active pattern 305 may be formed by performing a shallow-trench isolation (STI) process on an upper portion of the substrate 300. For example, after partially etching the upper portion of the substrate 300 to form a device isolation trench, an insulating layer may be formed on the substrate 300 to fill the device isolation trench. The insulating layer may be planarized until a top surface of the substrate 300 is exposed to form a device isolation layer 302. The insulating layer may include, for example, a silicon oxide layer.

By forming the device isolation layer 302, a plurality of protruding portions may be formed on the substrate 300. The protruding portions may be defined as active patterns 305. The active patterns 305 may respectively extend in a first direction, and may be spaced apart from each other in a second direction.

In some example embodiments, a well region may be further formed by implantation into an active pattern 305.

An upper portion of the device isolation layer 302 may be partially removed by an etch-back process. Accordingly, an upper portion of the active pattern 305 may be exposed. The exposed upper portion of the active pattern 305 may be defined an active fin 307. The active fin 307 may extend in the first direction, and a plurality of active fins 307 may be arranged in the second direction.

A dummy gate insulating layer, a dummy gate electrode layer and a dummy gate mask layer may be formed, for example sequentially formed on the active fin 307 and the device isolation layer 302. The dummy gate mask layer may be patterned by a photolithography and etch process to form a gate mask 314. The dummy gate electrode layer and the dummy gate insulating layer may be etched, for example sequentially etched using the dummy gate mask 314 as an etch mask to form a dummy gate structure 320.

The dummy gate structure 320 may include a dummy gate insulating pattern 310, a dummy gate electrode 312 and the dummy gate mask 314, which are stacked, for example sequentially stacked on the active fin 307 and the device isolation layer 302.

For example, the dummy gate insulating layer may include silicon oxide. The dummy gate electrode layer may include polycrystalline silicon. The dummy gate mask may include silicon nitride.

According to some example embodiments, the dummy gate structure 320 may extend in the second direction, and may cross a plurality of the active pins 307. In addition, a plurality of the dummy gate structures 320 may be spaced apart from each other in the first direction.

Next, a gate spacer 325 may be formed a sidewall of the dummy gate structure 320. For example, a spacer layer may be formed on the dummy gate structure 320, the active fin 307 and the device isolation layer 302. The spacer layer may be anisotropically etched to form the gate spacer 325. The spacer layer may include nitride materials such as silicon nitride, silicon oxynitride and silicon carbon nitride.

Figure 43:
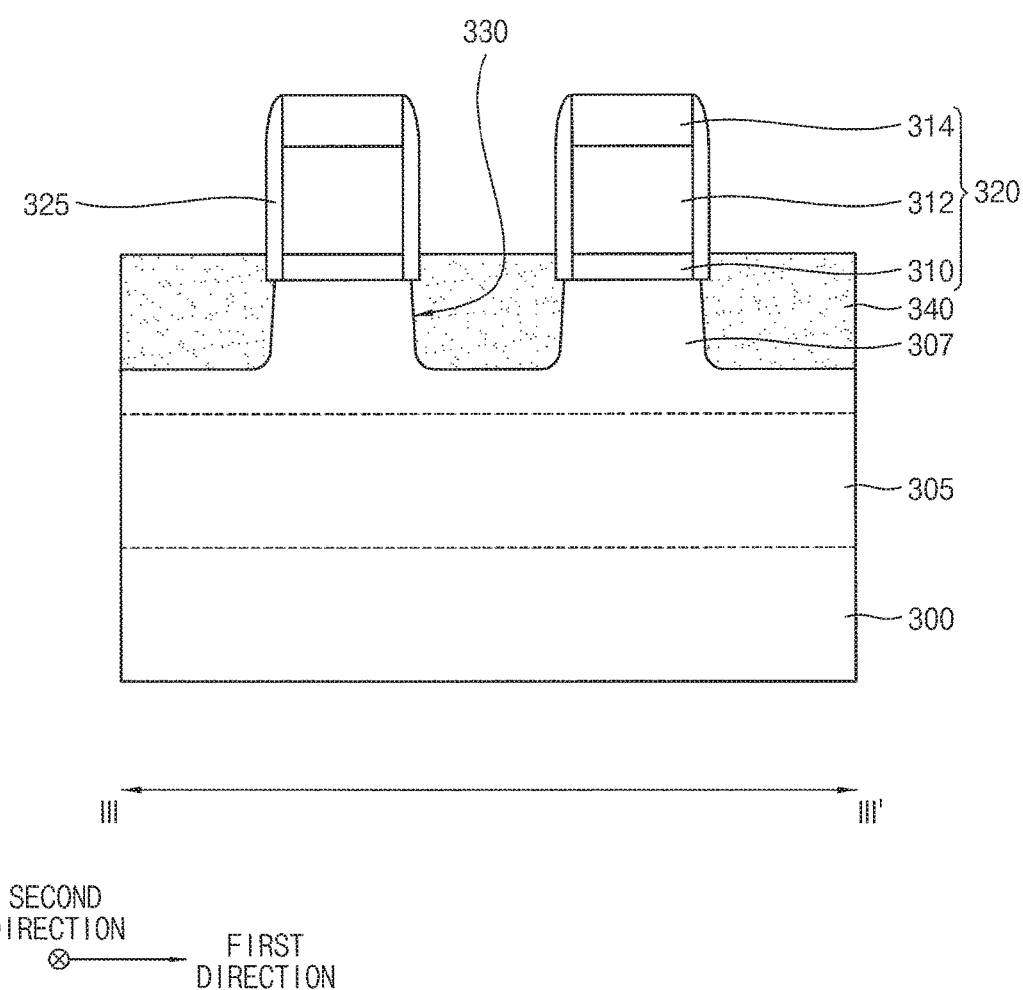

As shown in FIG. 40, the gate spacer 325 may extend together with the dummy gate structure 320 in the second direction Referring to FIG. 43, an upper portion of the active pattern may be partially etched using the gate spacer 325 and the dummy gate structure 320 as an etch mask to form a recess 330.

Next, a source/drain layer 340 may fill the recess 330. The source/drain layer 340 may be formed through a selective epitaxial growth (SEG) process using a top surface of the active fin 307 exposed by the recess 330 as a seed layer. During the selective epitaxial growth (SEG) process, n-type or p-type impurities may be doped.

Figure 44:
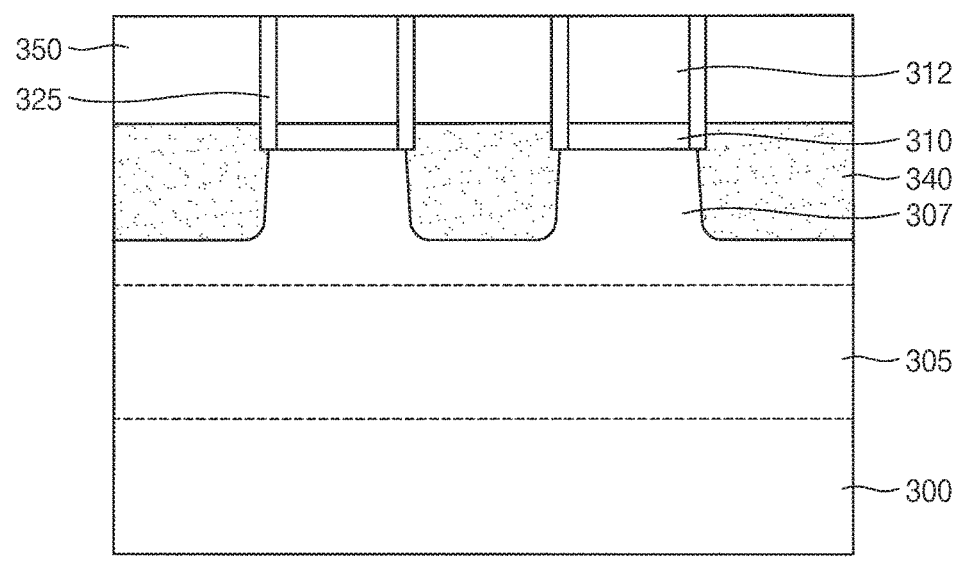

Referring to FIG. 44, a first interlayer insulating layer may be formed on the active fin 307 and the device isolation layer 302 to cover the dummy gate structure 320, the gate spacer 325 and the source/drain layer 340. Next, the first interlayer insulating layer 350 may be planarized by a CMP process or an etch-back process until a top surface of the dummy gate electrode 312 is exposed.

In some example embodiments, the dummy gate mask 314 may be removed by the CMP process. In addition, a portion of the gate spacer 325 may be also removed by the CMP process.

Figure 45:
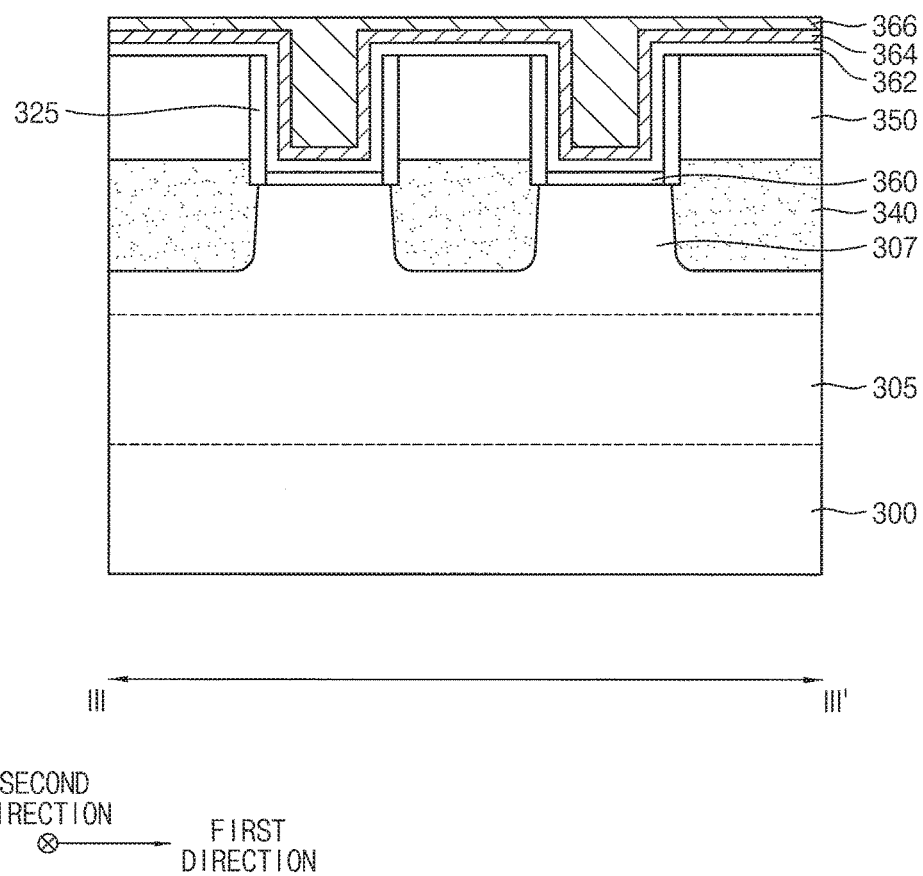

Referring to FIG. 45, the dummy gate electrode 312 and the dummy gate insulating pattern 310 may be removed. Accordingly, an opening (not shown) may be formed between a pair of the gate spacers 325 to expose a top surface of the active fin 307.

An interface layer 360 may be formed by a thermal oxidation process that consumes a portion of the exposed active fin 307. Next, a gate insulating layer 362 may be formed along a top surface of the first interlayer insulating layer, an inner sidewall opening, top surfaces of the interface layer 360 and a top surface of the device isolation layer 302. A buffer layer 364 may be formed on the gate insulating layer 362. A gate electrode layer 366 may be formed on the buffer layer 364 to fill a remaining portion of the opening.

The gate insulating layer 362 may formed of or include metal oxide having a high dielectric constant. For example, the gate insulating layer 362 may include hafnium oxide, tantalum oxide and/or zirconium oxide. The buffer layer 364 may be inserted for adjusting a work function of the gate electrode. The buffer layer 364 may be formed of or include metal nitride such as titanium, tantalum and aluminum. The gate electrode layer 366 may be formed of or include a low-resistance metal such as aluminum, copper and tungsten.

The gate insulating layer 362, the buffer layer 364 and the gate electrode layer 366 may be formed by a CVD, ALD, PVD, the like or a combination thereof.

Figure 46:
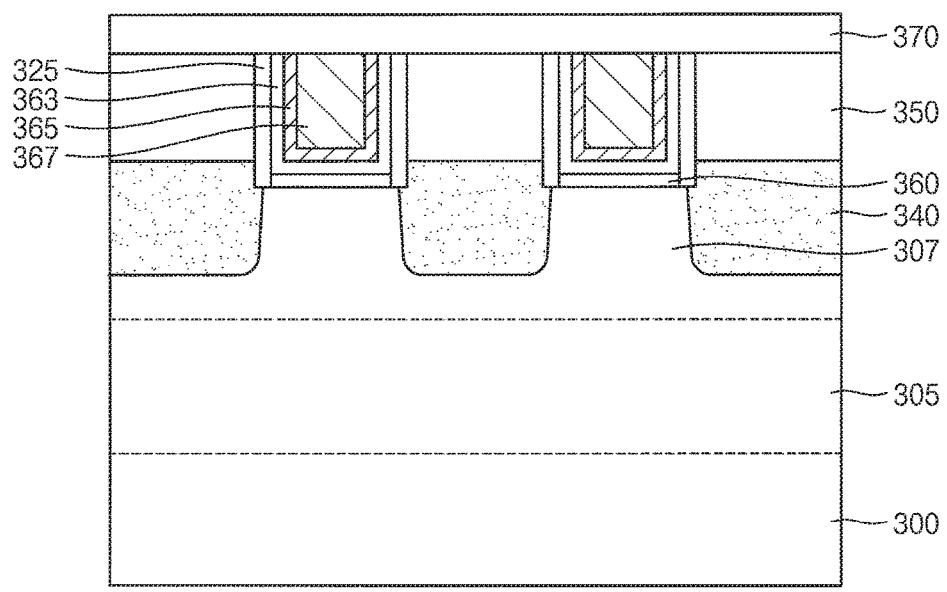
Figure 46:

Referring to FIG. 46, upper portions of the gate electrode layer 366, the buffer layer 364 and the gate insulating layer 362 may be planarized by a CMP process until a top surface of the first interlayer insulating layer 350 is exposed.

Accordingly, a gate structure may be formed inside of the opening. The gate structure may have a stacked structure that is sequentially stacked with the interface layer 360, the gate insulating pattern 363, the buffer pattern 365 and the gate electrode 367. NMOS or PMOS FinFET transistor may be defined by the gate structure and the source/drain layer 340.

Next, a passivation layer 370 may be formed on the first interlayer insulating layer 350, the gate spacer 325 and the gate structure. The passivation layer 370 may be formed of or include silicon nitride, silicon oxynitride, the like or a combination thereof, formed by a CVD process.

Figure 47:
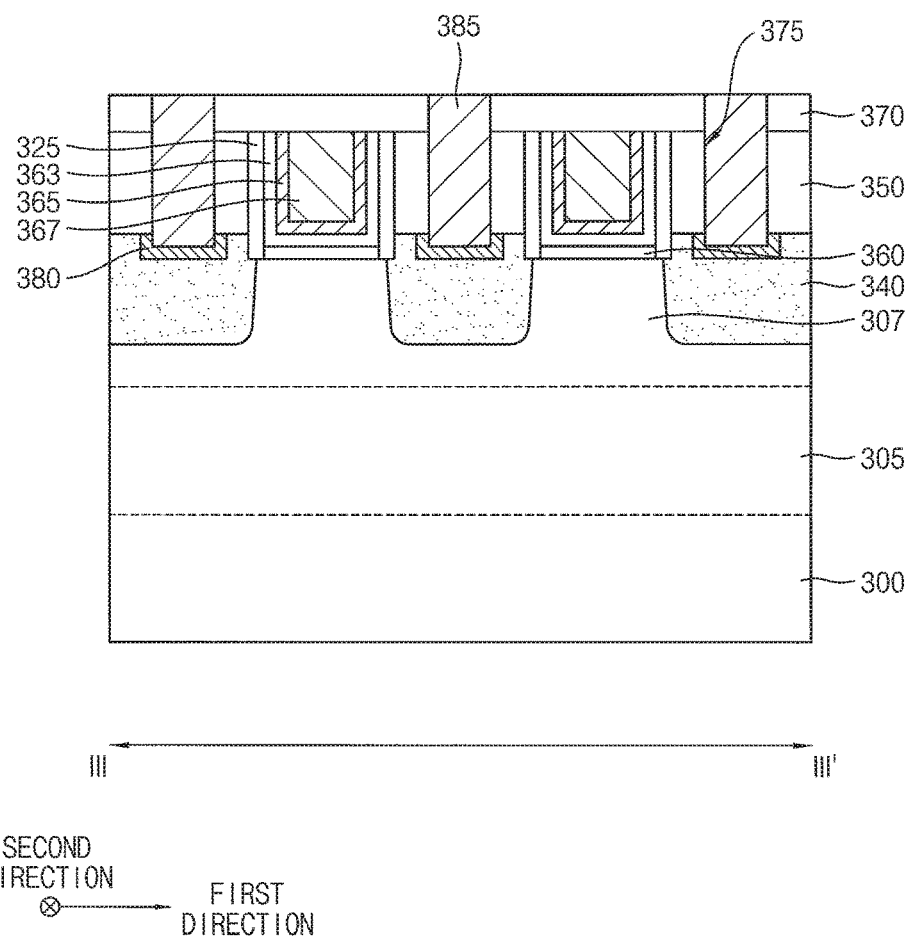

Referring to FIG. 47, a contact plug 385 may be formed through passivation layer 370 and the first interlayer insulating layer 350 to be electrically connected to the source/drain layer 340.

According to some example embodiments, the passivation layer 370 and the first interlayer insulating layer 350 may be etched to form a contact hole 375 through which the source/drain layer 340 is exposed.

In some example embodiments, a silicide layer 380 may be formed on an upper portion of the source/drain layer 340 exposed by the contact hole 375. For example, a metal layer may be formed on the source/drain layer 340 exposed by the contact hole 375, and a thermal treatment such as an annealing process may be performed. Portions of the metal layer and the source/drain layer 340 may be converted into metal silicide. After the thermal treatment is performed, unreacted metal may be removed through a cleaning process to form the silicide layer 380.

The metal layer may be formed of or include, for example, cobalt or nickel. Accordingly, the silicide layer 380 may include metal silicide such as cobalt silicide or nickel silicide.

Next, a conductive layer may be formed on the passivation layer 370 to fully fill the contact hole 375. An upper portion of the conductive layer may be planarized by a CMP process until a top surface of the passivation layer 375 is exposed to form the contact plug 385. The conductive layer may be formed of or include metal, metal nitride, metal silicide or doped polysilicon.

Figure 48:
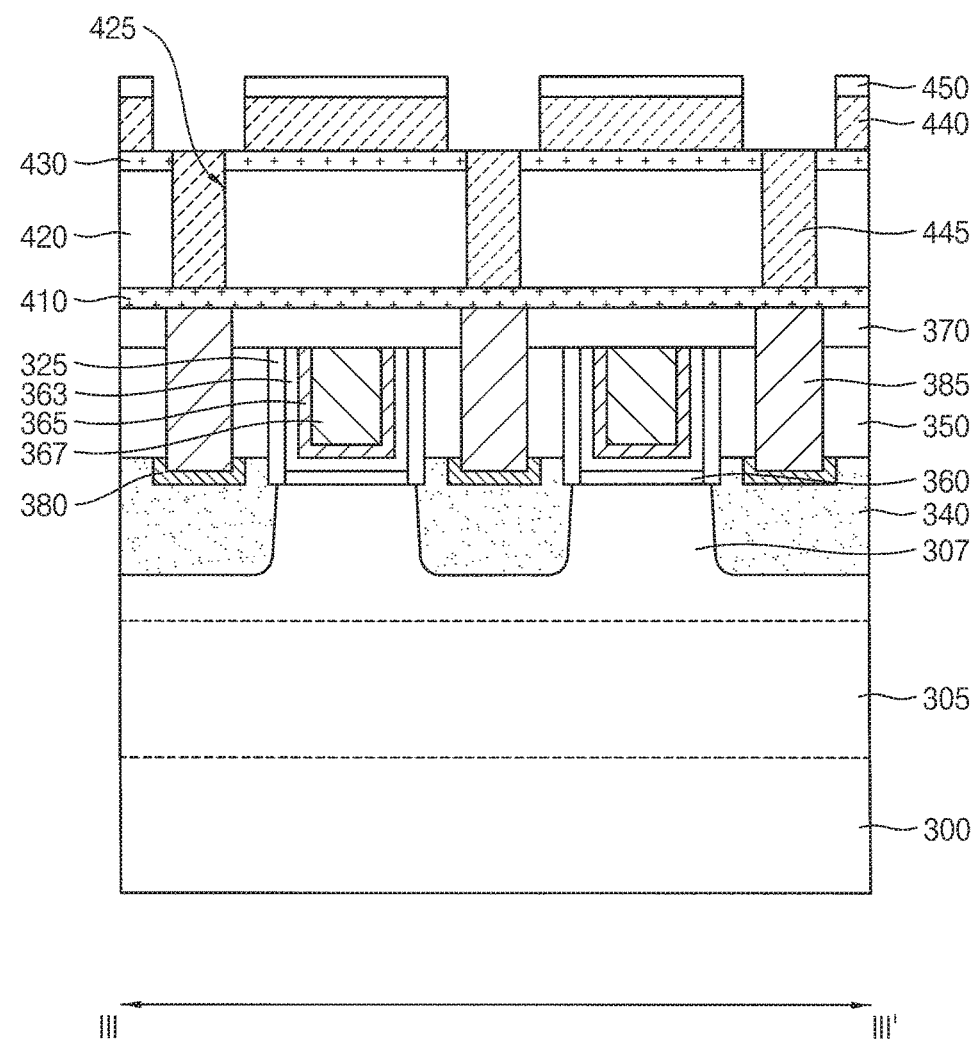

Referring to FIG. 48, Processes substantially similar to or the same as the processes described with reference to FIGS. 1 to 8 may be performed.

According to some example embodiments, a first etch stop layer 410 may cover the passivation layer 370 and the contact plug 385, and a second interlayer insulating layer 420 and a second etch stop layer 430 may be formed on the first etch stop layer 410.

Preliminary holes 425 may be formed through the second etch stop layer 430 and the second interlayer insulating layer 420, and a second hard mask 440 and a second upper mask 450 may be formed on the second etch stop layer 430. A sacrificial pattern 445 may be formed inside the preliminary hole 425.

Figure 49:
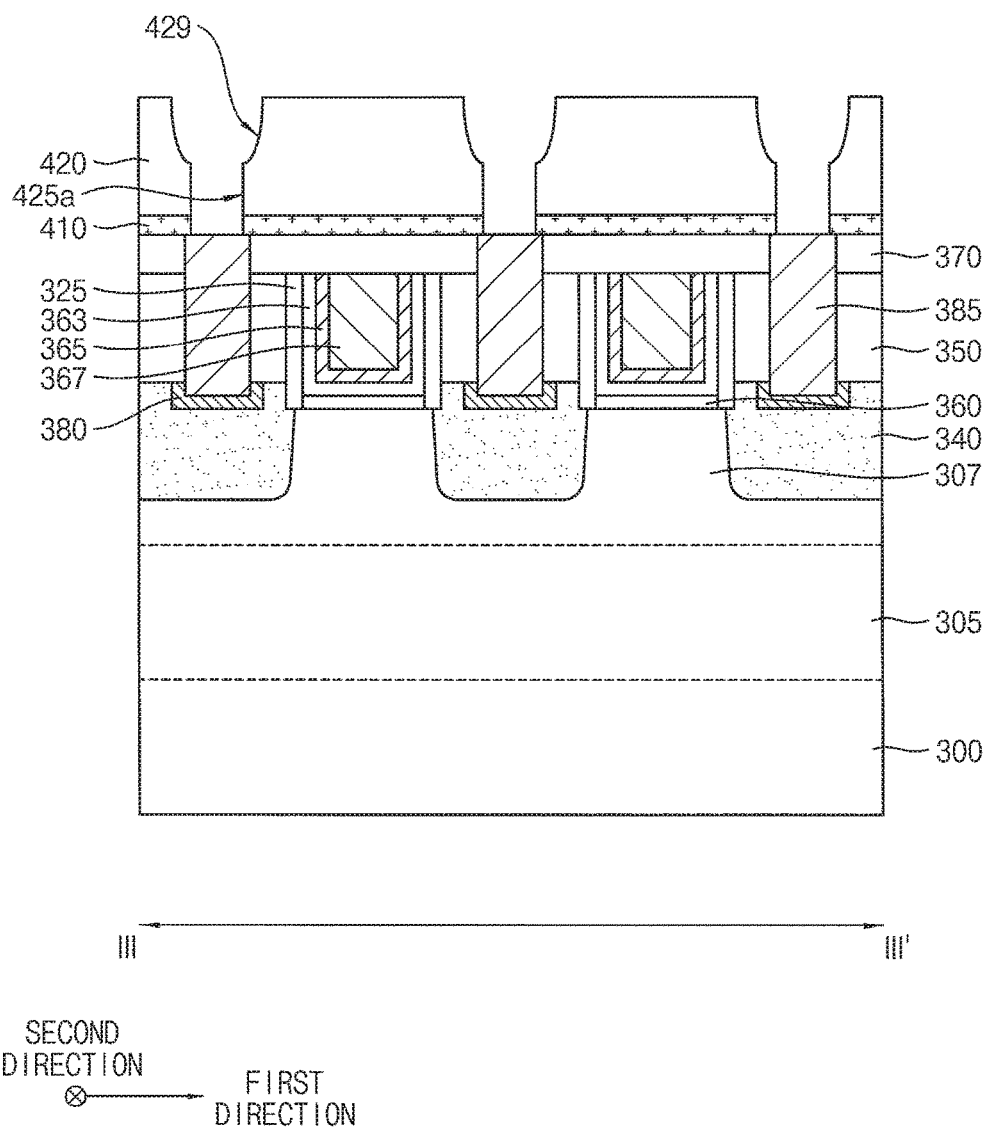

Referring to FIG. 49, Processes substantially similar to or the same as the processes described with reference to FIGS. 9 to 12 may be performed.

According to some example embodiments, the sacrificial pattern may be removed, and then the second interlayer insulating layer 420 may be partially etched using the second hard mask 440 as an etch mask to form a trench 429. The remaining portion of the sacrificial pattern 445 and the second hard mask 440 may be removed by an ashing process and/or a strip process to form a via-hole 425a. The via-hole 425a may be merged to communicate with the trench 429 by removing the sacrificial pattern 445.

Next, the second etch stop layer 430 may be removed by a nitride etching process, and the first etch stop layer 410 may be also partially removed through the via-hole 425a to expose a top surface of the contact plug 385.

Figure 50:
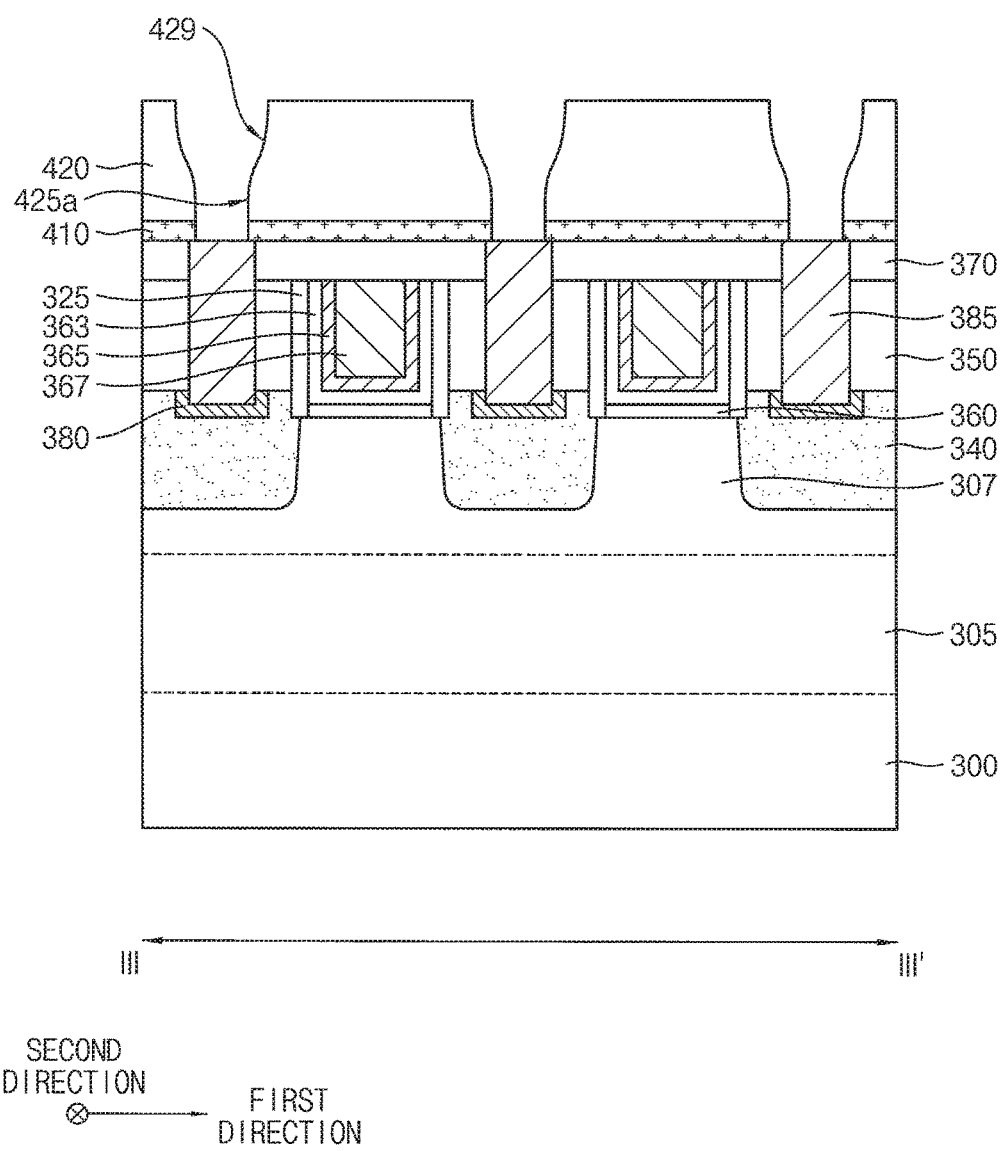

Referring to FIG. 50, a contact area of the trench 429 and the via-hole 425a may be partially etched in a manner substantially similar to or the same as the process described with reference to FIG. 13.

Figure 51:
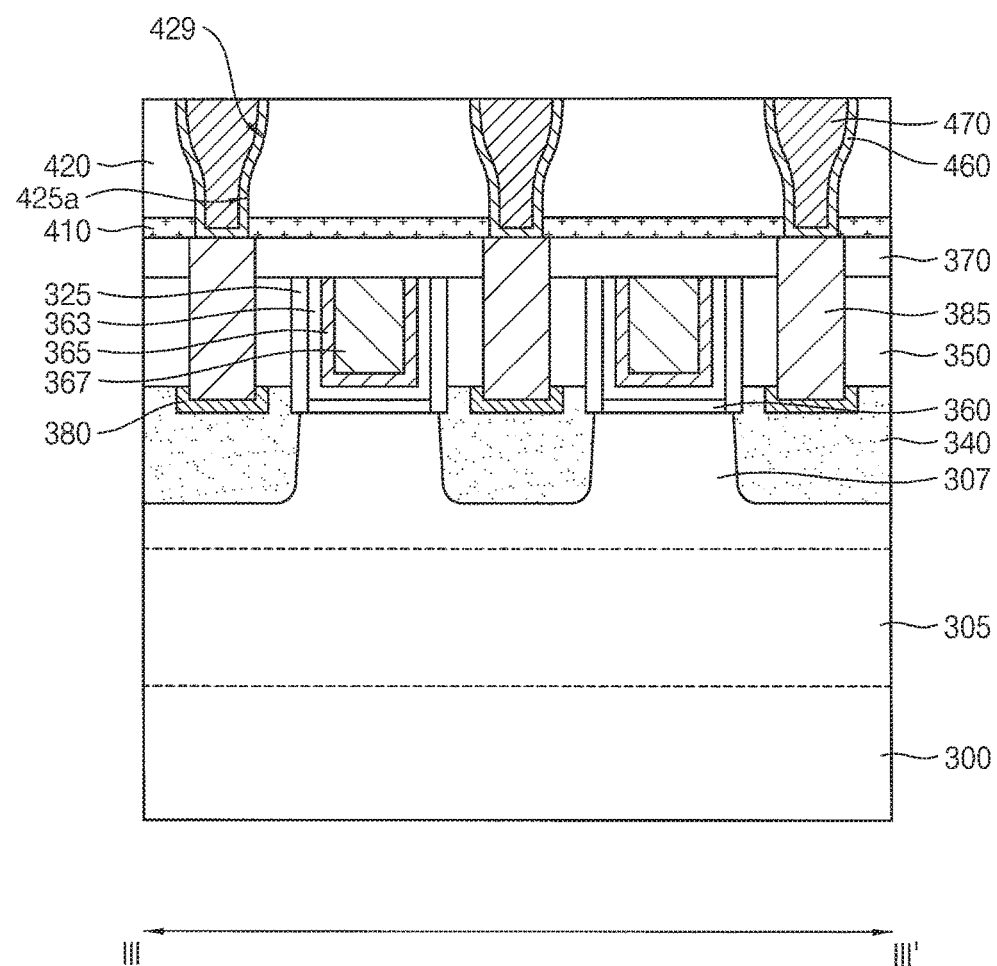

Referring to FIG. 51, an upper wiring may be formed in manners substantially similar to or the same as the processes described with reference to FIG. 14 or 23 to 25, to be electrically connected to the contact plug 385.

The upper wiring may include a barrier conductive pattern 460 and a metal pattern 470. The barrier conductive pattern 460 may be formed on inner sidewalls of the trench 429 and the via-hole 425a and the top surface of the contact plug 385. The metal pattern 470 may be formed on the barrier conductive pattern 460 to fill the trench 429 and the via-hole 425a.

Accordingly, in highly integrated logic devices, the upper wiring may be formed with uniform critical dimension and few or no defect such as void, crack and seam in an inside thereof.

According to some example embodiments as described above, the wiring structure and its forming method may be used in various semiconductor devices that require a fine pattern formation. For example, the wiring structure and its forming method may be applied to a volatile memory device such as logic devices including a FinFET structure, SRAM device and DRAM device, and a nonvolatile memory device such as flash memory device, PRAM device, MRAM device and RRAM device.

While some embodiments of the inventive concepts have been particularly shown and described, it will be understood by one of ordinary skill in the art that variations in form and detail may be made therein without departing from the spirit and scope of the attached claims.

What is claimed is:

1. A method of fabricating a wiring structure for a semiconductor device, the method comprising:
   forming a lower wiring in a lower insulating layer;
   forming an etch stop layer covering the lower insulating layer and the lower wiring;
   forming an interlayer insulating layer on the etch stop layer;
   forming a preliminary via-hole through the interlayer insulating layer;
   forming a preliminary trench in the interlayer insulating layer such that the preliminary trench is connected with the preliminary via-hole in which a sacrificial pattern is partially arranged;
   partially etching the interlayer insulating layer in the preliminary trench to form a trench having a bottom surface at a same level as a top surface of the sacrificial pattern;
   removing the sacrificial pattern from the preliminary via-hole to form a via-hole through which the etch stop layer is exposed;
   removing the etch stop layer from the via-hole such that the lower wiring and a side surface of the etch stop layer is exposed through the via-hole;
   partially etching a contact area at an etching selectivity with respect to the etch stop layer under the interlayer insulating layer, the contact area being a boundary area at which the trench and the via-hole are in contact with each other; and
   forming an upper wiring in the via-hole and the trench to be electrically connected to the lower wiring.

2. The method of claim 1, wherein
the etch stop layer includes a nitride material, and
the interlayer insulating layer includes an oxide material.

3. The method of claim 2, wherein:
the removing the etch stop layer includes performing a nitride etching process, and
the partially etching a contact area includes performing an oxide etching process.

4. The method of claim 3, wherein:
the nitride etching process includes a dry etching process using a first fluorine-containing gas and a nitride etching-facilitating gas, and
the oxide etching process includes a dry etching process using a second fluorine-containing gas and an oxide etching-facilitating gas.

5. The method of claim 1, wherein forming the preliminary trench in the interlayer insulating layer comprises:
   forming a hard mask layer on the interlayer insulating layer such that the preliminary via-hole is filled up with, and the interlayer insulating layer is covered with, the hard mask layer;
   partially removing the hard mask layer to form a hard mask defining the preliminary trench through which the hard mask layer in the preliminary via-hole is exposed as the sacrificial pattern; and
   removing an upper portion of the sacrificial pattern from the preliminary via-hole.

6. The method of claim 1, wherein partially etching the contact area of the via-hole and the trench comprises reducing a contact angle of the via-hole and the trench.

7. The method of claim 1, further comprising etching an upper portion of the interlayer insulating layer including forming an additional trench that is spaced apart from the trench and separated from the preliminary via-hole.

8. The method of claim 1, wherein the forming a preliminary via-hole comprises forming a first preliminary via-hole and a second preliminary via-hole, and the trench is connected to upper portions of the first preliminary via-hole and the second preliminary via-hole.

9. A method of fabricating a wiring structure for a semiconductor device, the method comprising:
   forming a lower wiring in a lower insulating layer;
   forming a first etch stop layer covering the lower insulating layer and the lower wiring;
   forming an interlayer insulating layer on the first etch stop layer;
   forming a preliminary via-hole through the interlayer insulating layer;
   forming a sacrificial pattern in the preliminary via-hole;
   partially removing an upper portion of the sacrificial pattern;
   partially etching the interlayer insulating layer to form a trench having a bottom surface at a same level as a top surface of the sacrificial pattern in the preliminary via-hole;
   removing the sacrificial pattern from the preliminary via-hole to form a via-hole connected with the trench and exposing the first etch stop layer;
   etching the first etch stop layer exposed through the via-hole to expose the lower wiring;
   etching a contact area where the trench and the via-hole are in contact with each other, the etching a contact area being subsequent to forming a lower wiring, forming a first etch stop layer, forming an interlayer insulating layer, forming a preliminary via-hole, forming a sacrificial pattern, partially removing an upper portion of the sacrificial pattern, partially etching the interlayer insulating layer, removing the sacrificial pattern, and etching the first etch stop layer; and
   forming an upper wiring in the trench and the via-hole to be electrically connected to the lower wiring.

10. The method of claim 9, wherein the etching the contact area has an etching selectivity with respect to the first etch stop layer.

11. The method of claim 10, wherein the first etch stop layer and the interlayer insulating layer include nitride and oxide, respectively, and
wherein the contact area of the trench and the via-hole is etched by a dry etching process having a high selectivity of nitride to oxide.

12. The method of claim 9, further comprising:
forming a second etch stop layer on the interlayer insulating layer,
wherein the preliminary via-hole penetrates the second etch stop layer and the interlayer insulating layer.

13. The method of claim 12, wherein the first etch stop layer is contemporaneously removed with the second etch stop layer.

14. The method of claim 12, wherein forming the sacrificial pattern in the preliminary via-hole comprises:
forming a hard mask layer on the second etch stop layer such that the preliminary via-hole is filled with the hard mask layer; and
partially removing the hard mask layer to form a hard mask defining a preliminary trench through which the preliminary via-hole and the second etch stop layer around the preliminary via-hole are exposed, the hard mask layer in the preliminary via-hole being formed into the sacrificial pattern, the top surface of the sacrificial pattern being at a same level as a top surface of the second etch stop layer.

15. A method of fabricating a wiring structure for a semiconductor device, the method comprising:
forming a lower structure;
forming an interlayer insulating layer on the lower structure;
forming a via-hole through the interlayer insulating layer, the via-hole having a width;
partially filling the via-hole with a sacrificial pattern, the sacrificial pattern having a height;
etching a portion of the interlayer insulating layer to form a trench, the trench being wider than the width of the via-hole, a distance between a lower surface of the trench and the lower structure being equal to the height of the sacrificial pattern;
etching the lower structure;
etching a contact area where the trench and the via-hole are in contact with each other, the etching a contact area being subsequent to forming a lower structure, forming an interlayer insulating layer, forming a via-hole, partially filling the via-hole, etching a portion of the interlayer insulating layer, and etching the lower structure; and
forming an upper wiring in the via-hole and the trench electrically connected to the lower structure,
wherein the forming a lower structure includes,
forming a lower insulating layer;
forming a lower wiring in the lower insulating layer; and
forming an etch stop layer on the lower insulating layer and the lower wiring.

16. The method of claim 15, wherein the etching the lower structure comprises removing a portion of the etch stop layer that is on the lower wiring to expose the lower wiring.

17. The method of claim 16, wherein the forming an upper wiring in the via-hole and the trench comprises:
etching the sacrificial pattern; and
electrically connecting the trench and the via-hole to the lower wiring.

* * * * *